(12) United States Patent
Ipposhi

(10) Patent No.: US 7,183,624 B2
(45) Date of Patent: Feb. 27, 2007

(54) SEMICONDUCTOR DEVICE

(75) Inventor: Takashi Ipposhi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 69 days.

(21) Appl. No.: 10/887,839

(22) Filed: Jul. 12, 2004

(65) Prior Publication Data
US 2005/0012153 A1 Jan. 20, 2005

(51) Int. Cl.
H01L 29/00 (2006.01)

(52) U.S. Cl. ............... 257/531; 257/347; 257/E29.287

(58) Field of Classification Search ............... 257/531, 257/347
See application file for complete search history.

(56) References Cited

U.S. PATENT DOCUMENTS

| 5,742,091 | A * | 4/1998 | Hebert ............... 257/531 |
| 6,326,673 | B1 * | 12/2001 | Liou ............... 257/531 |
| 6,373,121 | B1 * | 4/2002 | Pan ............... 257/531 |
| 6,426,543 | B1 | 7/2002 | Maeda et al. |
| 6,452,249 | B1 * | 9/2002 | Maeda et al. ............... 257/531 |
| 6,541,841 | B2 | 4/2003 | Maeda et al. |
| 6,611,041 | B2 | 8/2003 | Maeda et al. |
| 6,638,844 | B1 * | 10/2003 | Verma et al. ............... 438/598 |
| 6,727,572 | B2 | 4/2004 | Maeda et al. |
| 6,849,913 | B2 * | 2/2005 | Ohkubo et al. ............... 257/428 |
| 2002/0036335 | A1 * | 3/2002 | Minami ............... 257/531 |
| 2004/0004255 | A1 * | 1/2004 | Yoshimura ............... 257/379 |

FOREIGN PATENT DOCUMENTS

| KR | 2001-0098377 | 11/2001 |
| KR | 2001-0110633 | 12/2002 |

OTHER PUBLICATIONS

Y. Hirano, et al. "Bulk-Layout-Compatible μm SOl-CMOS Technology Using Using Boldy-Fixed Partial Trench Isolation (PTI)" 1999 IEEE Intenational SOL Conference, pp. pp. 131-132.

S. Maeda, et al. "Impact of 018 μm SOI CMOS Technology using Hydrid Trench Isolation with High Resistivity Substrate on Embedded RF/Analog Applications" , 2000 Symposium on VLSI Technology Digest of Techical Papers, pp. 154-155.

* cited by examiner

Primary Examiner—Thao X. Le
Assistant Examiner—Mursalin B. Hafiz
(74) Attorney, Agent, or Firm—McDermott Will & Emery LLP

(57) ABSTRACT

A transistor region is a region where a plurality of MOS transistors, including an MOS transistor, are formed, and a dummy region is a region lying under a spiral inductor. In the dummy region, a plurality of dummy active layers are disposed in the main surface of an SOI substrate and a plurality of dummy gate electrodes are disposed covering the respective dummy active layers. The arrangement pattern of the dummy active layers and the arrangement pattern of the dummy gate electrodes nearly match, so that the dummy gate electrodes are aligned accurately on the dummy active layers.

7 Claims, 24 Drawing Sheets

SEMICONDUCTOR DEVICE

BACKGROUND OF THE INVENTION

1. Field of the Invention

The present invention relates to semiconductor devices and particularly to a semiconductor device having an inductor.

2. Description of the Background Art

SOI (Silicon On Insulator) structure semiconductor devices (hereinafter referred to as SOI devices), which are formed on an SOI substrate having a silicon substrate and a buried oxide film and an SOI layer lying on the silicon substrate, offer reduced parasitic capacitance, stable high-speed operation, and reduced power consumption. The SOI devices are used in portable devices, for example.

Examples of the SOI devices include full trench isolation (FTI) structure SOI devices, in which elements are electrically isolated from each other by a full trench isolation insulating film formed by burying an insulator in a trench that is formed in the surface of the SOI layer to reach the buried oxide film. However, various problems exist due to substrate floating effect, e.g. carries (holes in NMOS) produced by impact ionization accumulate in the channel formation region to cause kinks or deteriorate the operating breakdown voltage, and the unstable potential of the channel formation region causes frequency dependency of delay time.

To solve these problems, partial trench isolation (PTI) structure has been proposed, in which an insulator is buried in a trench that is formed in the surface of the SOI layer in such a way that a given thickness of the SOI layer remains between the trench bottom and the buried oxide film.

Adopting the PTI structure enables carriers to move through the well region under the trench isolation insulating film to prevent the accumulation of carriers in the channel formation region, and makes it possible to fix the potential of the channel formation region through the well region, thus solving various problems due to the substrate floating effect. Such PTI structures are described in Y. Hirano et al., 1999 IEEE International SOI Conference, "Bulk-Layout-Compatible 0.18 μm SOI-CMOS Technology Using Body-Fixed Partial Trench Isolation (PTI)", pp. 131–132 and S. Maeda et al., 2000 Symposium on VLSI Technology Digest of Technical Papers, "Impact of 0.18 μm SOI CMOS Technology using Hybrid Partial Trench Isolation with High Resistivity Substrate on Embedded RF/Analog Applications".

However, in an SOI device adopting the PTI structure and having a spiral inductor (an inductance element), if the PTI structure is present under the inductor, the current flowing in the spiral inductor causes eddy current in the SOI layer (silicon layer) between the trench bottom and the buried oxide film, which causes electromagnetic induction loss. This reduces Q value (a value obtained by dividing the energy accumulated in the inductor by various losses) that represents inductor performance. Therefore a full trench isolation insulating film is provided in the entire area of the SOI layer that is located under the spiral inductor, with the PTI structure being absent under the spiral inductor.

Now, the spiral inductor has a rectangular contour having sides of several tens to several hundreds of micrometers. Thus, when a full trench isolation insulating film is formed as mentioned above, a region with no pattern extends over a large area corresponding to the area where the spiral inductor resides.

With such structure, a CMP (Chemical Mechanical Polishing) process for the formation of the full trench isolation insulating film excessively removes the full trench isolation insulating film over a desired amount of polishing, causing the thickness of the full trench isolation oxide to gradually decrease toward the center, i.e. so-called dishing.

In order to prevent the dishing, as described in Japanese Patent Application Laid-Open No. 2002-110908 (6th column, FIGS. 3 and 4), for example, a conventional structure has been proposed in which a plurality of dummy element regions are dispersively arranged under the area where the spiral inductor resides and in the vicinity thereof.

Thus, in an SOI device having a spiral inductor, providing a full trench isolation insulating film in the entire SOI layer area under the spiral inductor causes dishing during the manufacturing process.

SUMMARY OF THE INVENTION

In a semiconductor device having a spiral inductor, an object of the present invention is to provide a structure which more effectively prevents the occurrence of dishing under the spiral inductor.

According to an aspect of the present invention, a semiconductor device includes: an SOI substrate having a substrate portion as a foundation, a buried oxide film provided on the substrate portion, and an SOI layer provided on the buried oxide film; an inductance element provided above the SOI layer; an MOS transistor provided on the SOI substrate; a plurality of independent dummy active layers provided in a main surface of the SOI layer in a dummy region under the inductance element; and a plurality of independent dummy gate electrodes provided on the main surface of the SOI layer in the dummy region.

According to this semiconductor device, a plurality of independent dummy active layers are formed in the main surface of the SOI layer under the inductance element. In a CMP process for the formation of an isolation insulating film, for example, the presence of the plurality of dummy active layers prevents dishing by the CMP process. Also, the presence of a plurality of independent dummy gate electrodes on the main surface of the SOI layer under the inductance element prevents the etching rate of the formation of MOS transistor gate electrodes from differing between the area around the dummy region and other areas. This prevents differences among the dimensions of gate electrodes located in different positions.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. Structure of Spiral Inductor>

Figure 1:
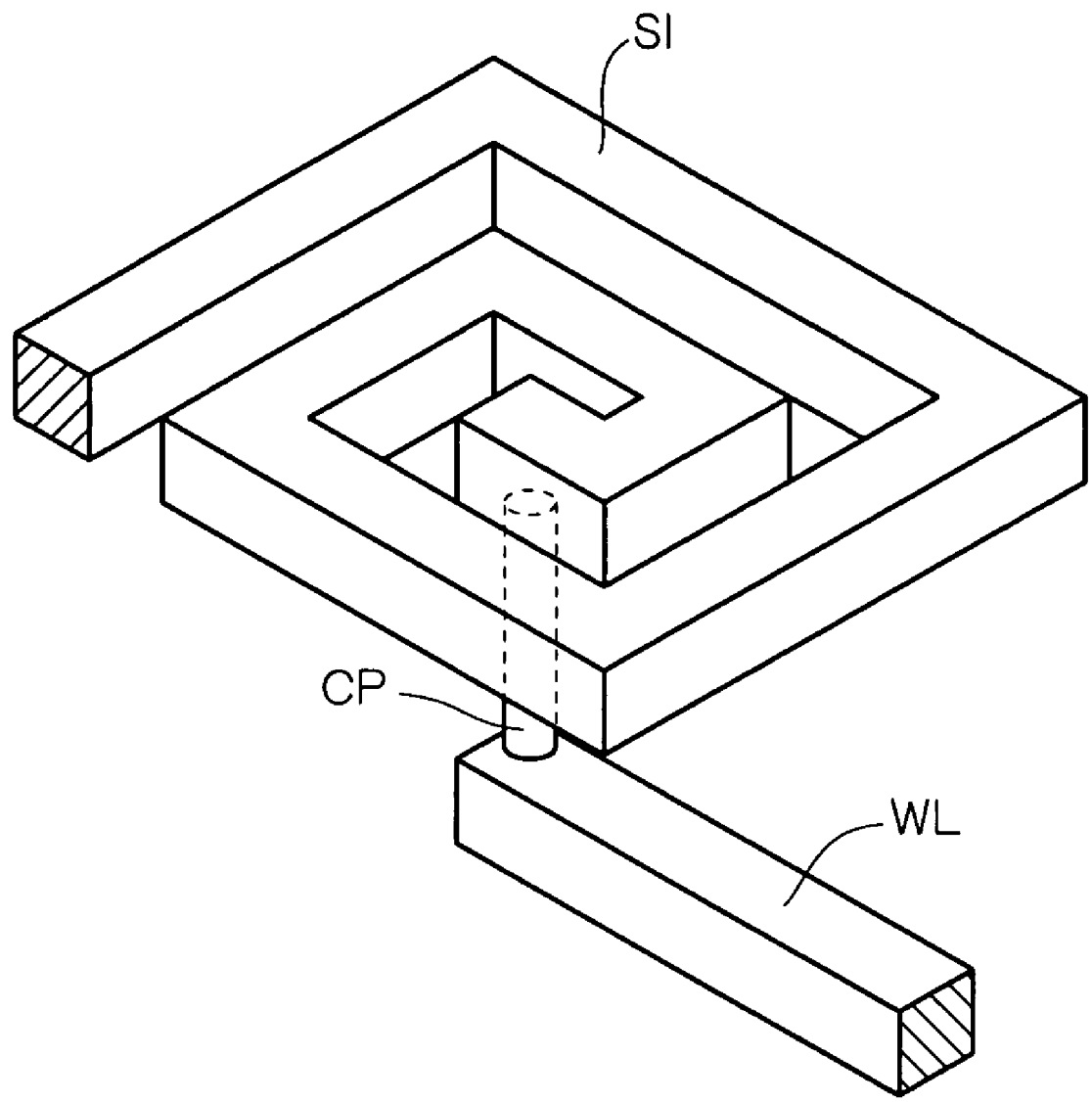
FIG. 1 is a perspective view showing the structure of a spiral inductor.

First, an example of the structure of a spiral inductor is described referring to FIG. 1. As shown in FIG. 1, a spiral inductor SI is formed by spirally winding an interconnection, whose one end at the center of the spiral is connected to a lower-layer interconnection WL through a contact CP passing through an interlayer insulating film (not shown). The other end of the spiral inductor SI is connected to an interconnection lying in the same layer as the spiral inductor SI, which is not shown in the drawing. The description below is made assuming that the spiral inductor SI is thus constructed.

<B. Structure of Device>

Figure 2:
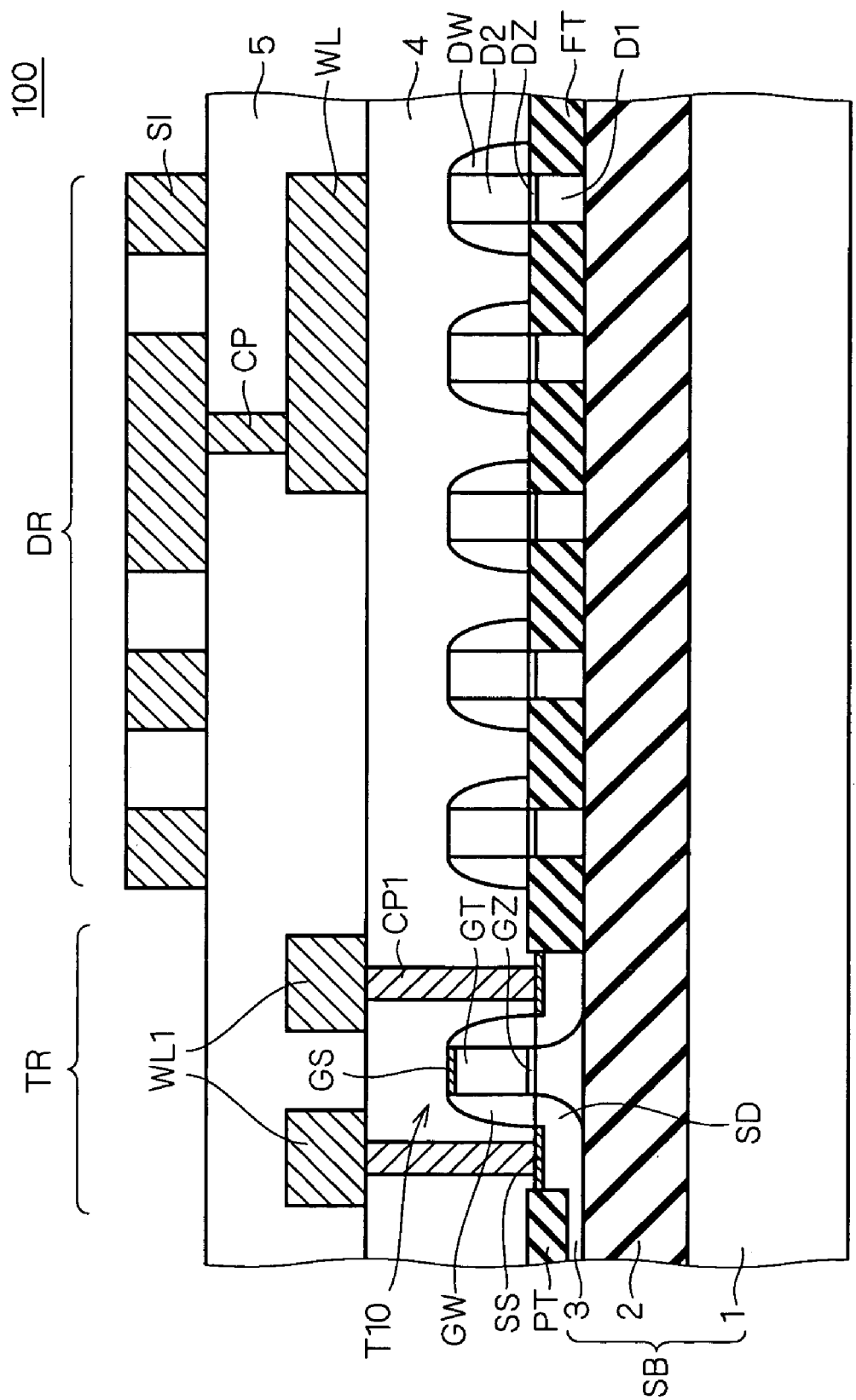
FIG. 2 is a cross-sectional view illustrating the structure of the semiconductor device of the preferred embodiment of the invention.

Next, the structure of a semiconductor device 100 according to the preferred embodiment of the invention is described referring to FIG. 2.

In FIG. 2, an SOI substrate SB is formed of a silicon substrate 1, a buried oxide film 2 provided on the silicon substrate 1, and an SOI layer 3 provided on the buried oxide film 2. The SOI substrate SB is sectioned into a transistor region TR and a dummy region DR.

The transistor region TR is a region where a plurality of MOS transistors, including an MOS transistor T10, are formed, and the dummy region DR is the region located under the spiral inductor SI. In the dummy region DR, a plurality of dummy active layers D1 are disposed in the main surface of the SOI substrate SB and a plurality of dummy gate electrodes D2 are disposed covering the respective dummy active layers D1. The arrangement pattern of the dummy active layers D1 and the arrangement pattern of the dummy gate electrodes D2 nearly match, so that the dummy gate electrodes D2 are aligned accurately on the dummy active layers D1.

The MOS transistor T10 includes a gate insulating film GZ formed on the SOI layer 3, a gate electrode GT formed on the gate insulating film GZ, a silicide film GS formed on the gate electrode GT, and sidewall insulating films GW formed to cover their side surfaces. The MOS transistor T10 further includes source/drain regions SD formed in the main surface areas of the SOI layer 3 outside the sidewall insulating films GW and silicide films SS formed on the source/drain regions SD.

The transistor region TR adopts a partial trench isolation (PTI) structure to electrically isolate elements, using, as a trench isolation insulating film, a partial isolation insulating film PT that allows a given thickness of the SOI layer 3 to be present between the trench bottom and the buried oxide film 2.

The plurality of dummy active layers D1 in the dummy region DR are independent island-like regions that are formed by sectioning the SOI layer 3 with a full trench isolation insulating film FT so that they do not come in contact with each other. The dummy active layers D1 are thus electrically isolated from each other.

Dummy gate insulating films DZ are formed on the respective dummy active layers D1 by the same process step as the gate insulating film GZ and the dummy gate electrodes D2 are provided on the respective dummy insulating films DZ. Each dummy gate electrode D2 has dummy sidewall insulating films DW covering its side surfaces. The dummy gate electrodes D2, too, are disposed independently of each other.

An interlayer insulating film 4 is provided to cover the entire surface of the SOI substrate SB including the transistor region TR and the dummy region DR. The interconnection WL is formed on the interlayer insulating film 4 and electrically connected to the spiral inductor SI and interconnections WL1 are also formed on the interlayer insulating film 4 and electrically connected to the source/drain regions SD of the MOS transistor T10.

The interconnections WL1 are electrically connected to the source/drain regions SD through contacts CP1 that pass through the interlayer insulating film 4 to reach the silicide films SS in the transistor region TR.

Also, an interlayer insulating film 5 lies on the interlayer insulating film 4 to cover the interconnections WL and WL1, where the interconnection WL is electrically connected to the spiral inductor SI through the contact CP that passes through the interlayer insulating film 5.

Figure 3:
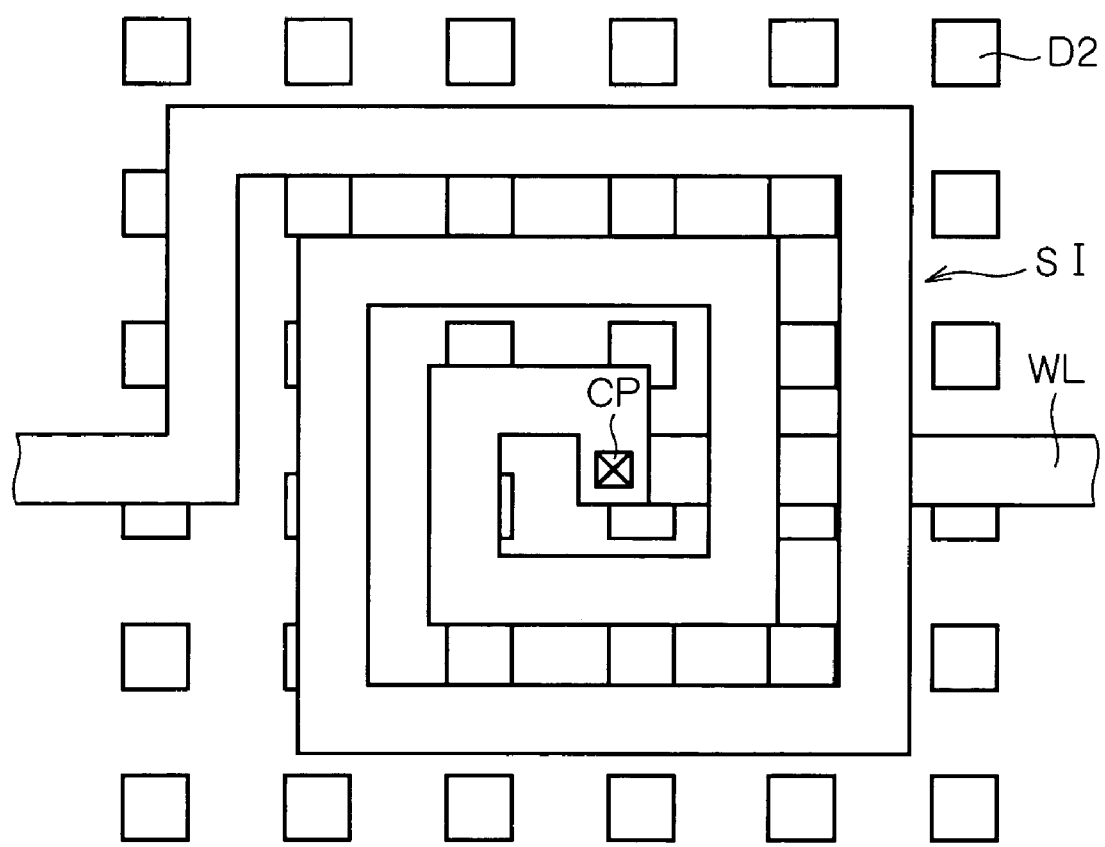
FIG. 3 is a plan view illustrating the arrangement of the spiral inductor and dummy gate electrodes under it.

Now, an example of plan view of the dummy region DR is described referring to FIG. 3. FIG. 3 is a plan view of the SOI substrate seen from above the spiral inductor SI, where the plurality of dummy gate electrodes D2 are disposed under the spiral inductor SI and in the vicinity thereof. In the plan view, each dummy gate electrode D2 is rectangular-shaped and preferably sized sufficiently smaller than the area of the spiral inductor SI; for example, they are formed in rectangles having sides of several micrometers. The dummy active layers D1 are shaped the same in plan view as the dummy gate electrodes D2. The shape of the dummy gate electrodes D2 in plan view is not limited to rectangular shape.

This structure prevents the CMP process from causing dishing and also prevents the etching rate of the formation of gate electrodes from differing between the vicinity of the region (the dummy region) under the spiral inductor SI and other regions, thereby preventing gate electrodes located in different positions from exhibiting different dimensions.

FIG. 3 shows an example in which the dummy gate electrodes D2 are regularly arranged in rows and columns and so the pattern occupation ratio is the same in the area under the spiral inductor SI and the surrounding area. However, the dummy gate electrodes D2 may be arranged so that the pattern occupation ratio of the dummy gate electrodes D2 in the area under the spiral inductor SI is lower than the pattern occupation ratio in the area surrounding the spiral inductor SI.

The pattern occupation ratio is an area ratio of pattern elements included in a unit area; for example, the pattern occupation ratio is 50% when pattern elements occupy half of a 100 μm square rectangular unit area.

<C. Manufacture Method>

Next, a method for manufacturing the semiconductor device 100 is described referring to the cross-sectional views of FIGS. 4 to 20 showing the sequence of process steps.

Figure 4:
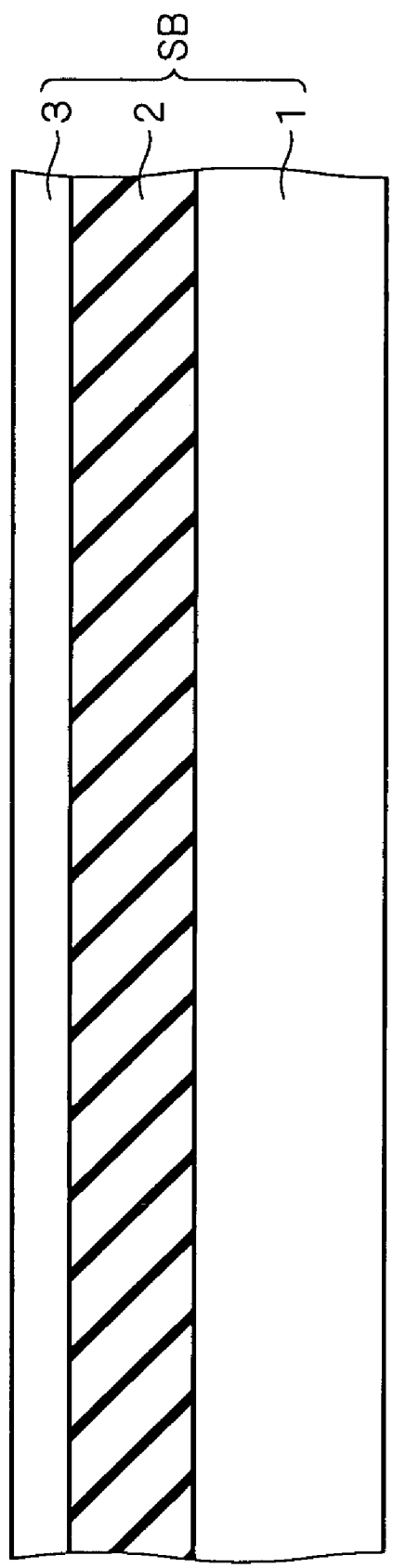
FIGS. 4 to 20 are cross-sectional views illustrating process steps for manufacturing the semiconductor device of the preferred embodiment of the invention.

First, as shown in FIG. 4, the SOI substrate SB is prepared, with the silicon substrate 1, the buried oxide film 2 provided on the silicon substrate 1, and the SOI layer 3 provided on the buried oxide film 2.

Figure 5:
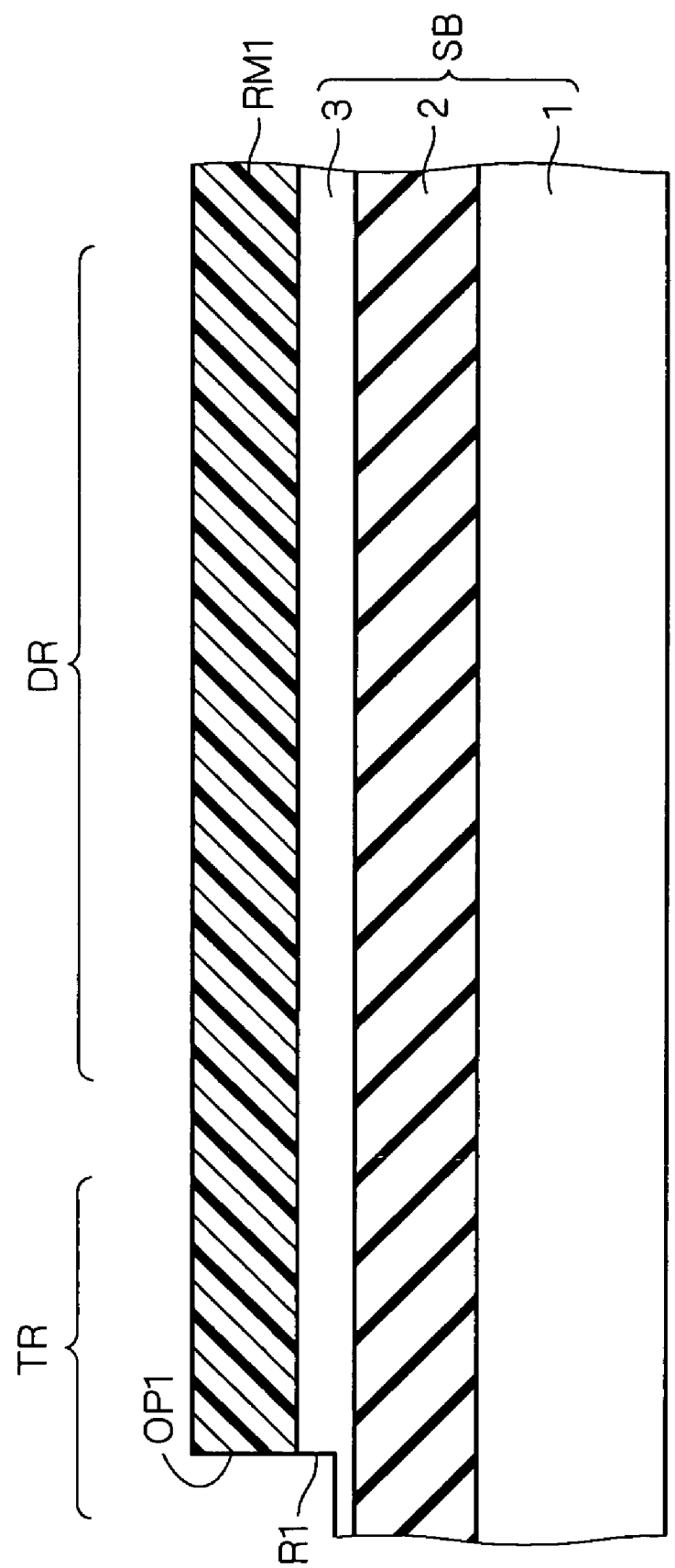

Next, in the process step of FIG. 5, a resist mask RM1 is patterned on the SOI substrate SB. This resist mask RM1 has a pattern in which an opening OP1 exists in the area of the transistor region TR where the partial isolation insulating film is formed later. Then the SOI layer 3 is selectively removed by etching using the resist mask RM1 to form a trench R1. This etching is carried out so that a given thickness of SOI layer 3 remains between the bottom of the trench R1 and the buried oxide film 2.

Figure 6:
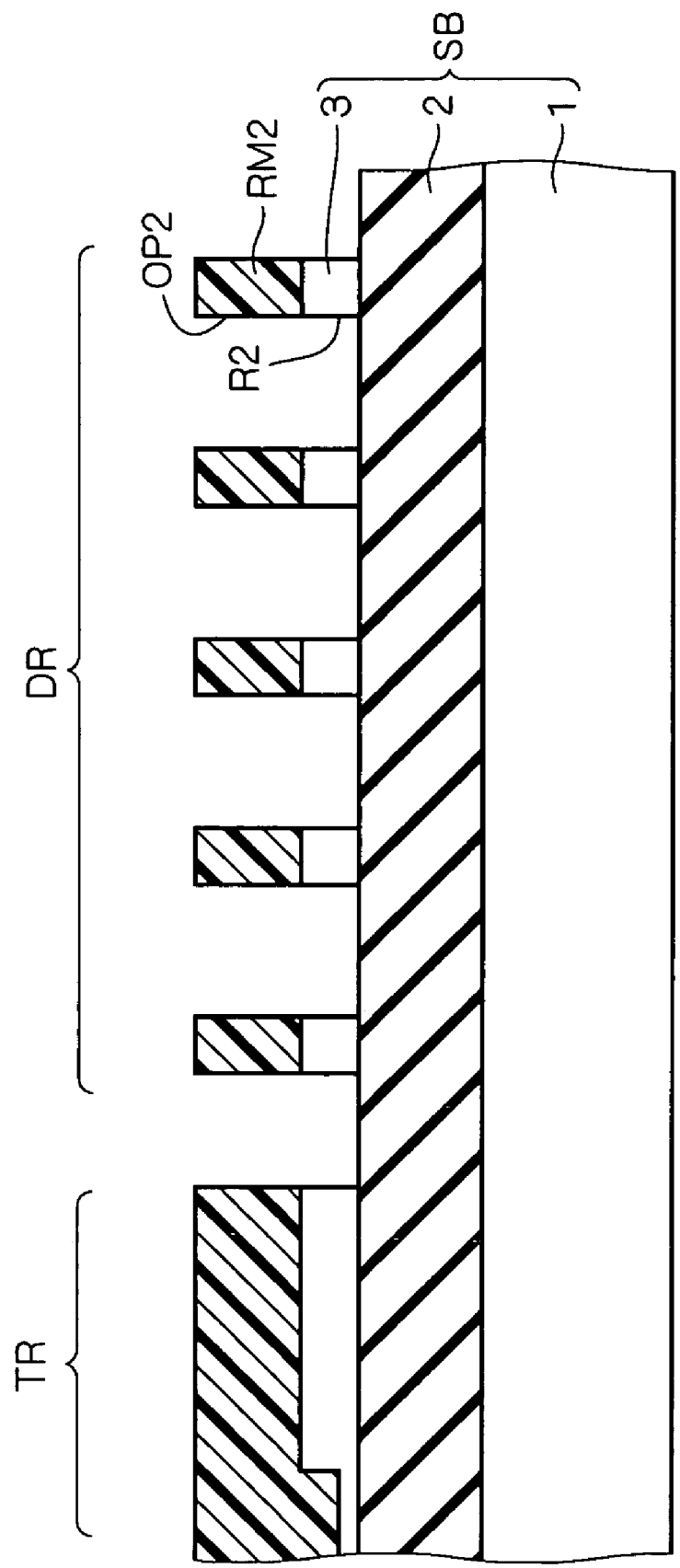

Next, after removal of the resist mask RM1, in the process step of FIG. 6, a resist mask RM2 is patterned on the SOI substrate SB. This resist mask RM2 has a pattern in which an opening OP2 exists in the area of the dummy region DR where the full isolation insulating film is formed later. Then the SOI layer 3 is selectively removed by etching using the resist mask RM2 to form a trench R2. This etching completely removes the SOI layer in the region not covered by the resist mask RM2 so that the surface of the buried oxide film 2 is exposed in the trench R2.

Figure 7:
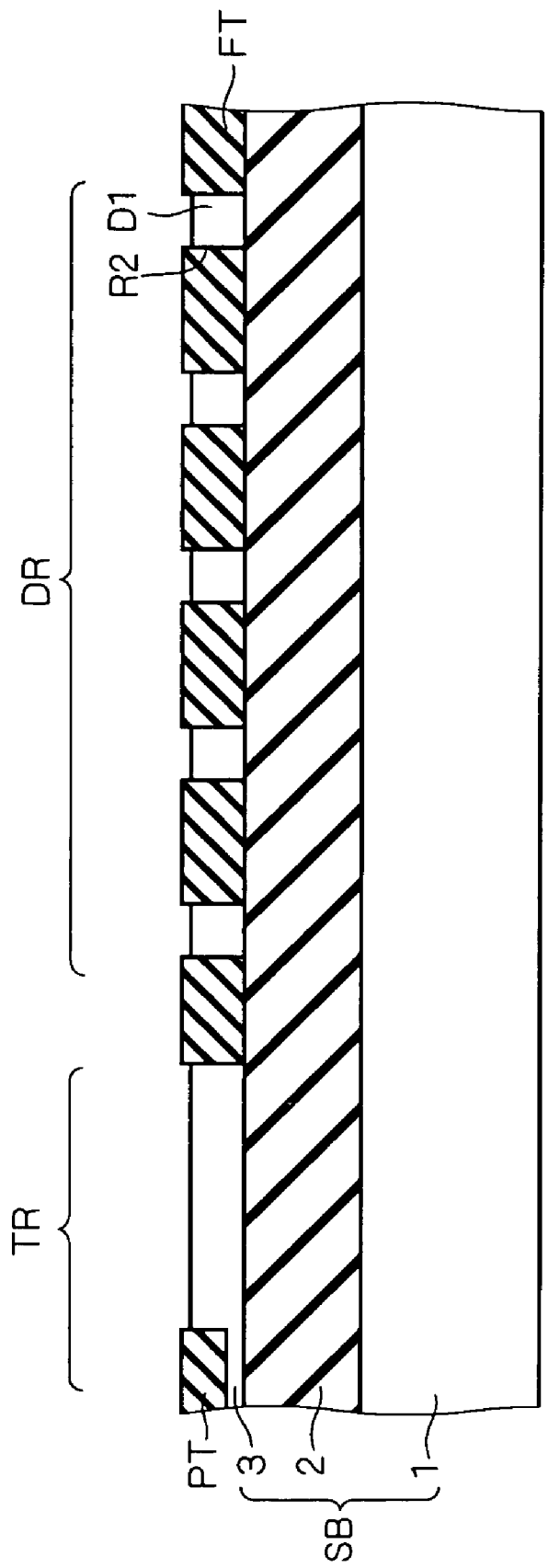

Next, after removal of the resist mask RM2, in the process step of FIG. 7, an insulating film is buried in the trenches R1 and R2 to form the partial isolation insulating film PT and the full isolation insulating film FT, respectively. More specifically, an insulating film, e.g. a silicon oxide film by CVD, is formed over the entire surface of the SOI substrate SB to fill the trenches R1 and R2 and then the insulating film is removed by CMP so that it remains only within the trenches R1 and R2, whereby the partial isolation insulating film PT and the full isolation insulating film FT are obtained.

The dummy active layers D1 can thus be formed easily by defining them with the full isolation insulating film FT in the dummy region DR.

Figure 8:
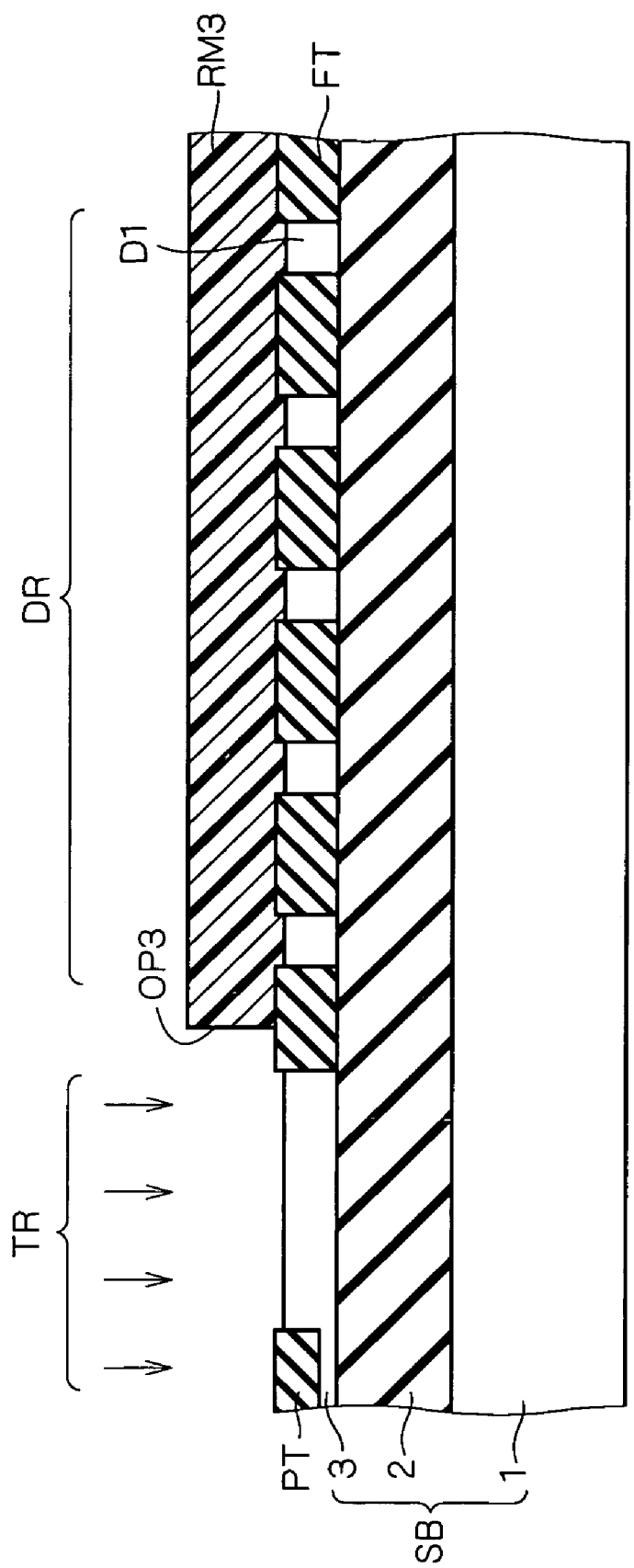

Next, in the process step of FIG. 8, a resist mask RM3 is patterned to form, in the transistor region TR, an opening OP3 above the area of the SOI layer 3 to which well implantation and channel implantation are to be applied. Then, using this resist mask RM3, well implantation and channel implantation are performed by ion implantation to the SOI layer 3 in the transistor region TR. The resist mask RM3 is patterned so that it at least covers the dummy region DR and it serves to prevent implantation of impurity ions into the dummy active layers D1 during the well implantation and channel implantation.

Figure 9:
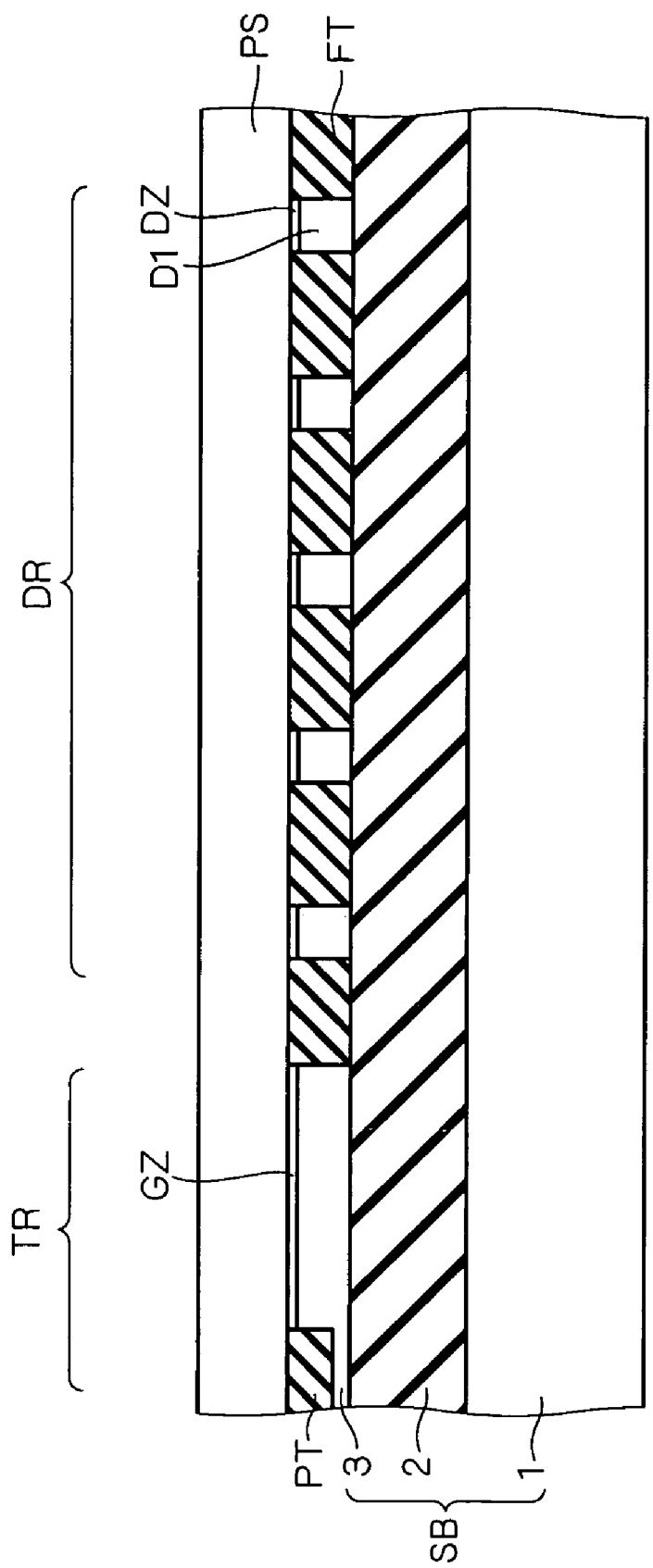

Next, after removal of the resist mask RM3, in the process step of FIG. 9, the gate insulating film GZ and dummy gate insulating films DZ are formed, e.g. by thermal oxidation, respectively on the SOI layer 3 in the transistor region TR and on the dummy active layers D1 in the dummy region DR. Subsequently, a polysilicon layer PS is formed, e.g. by CVD, all over the surface of the SOI substrate SB. This polysilicon layer PS is a non-doped polysilicon layer that contains no impurities.

Figure 10:
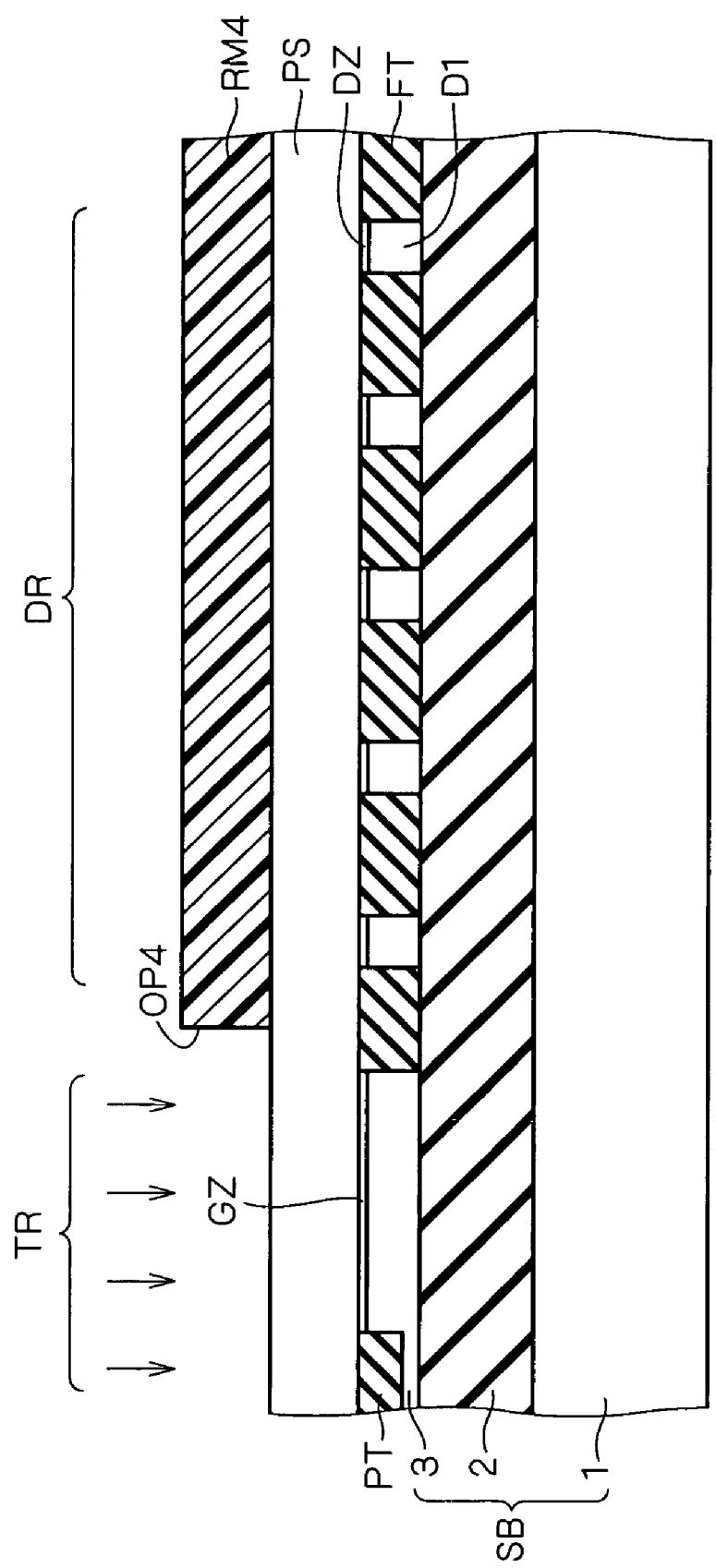

Next, in the process step of FIG. 10, a resist mask RM4 is patterned so that, in the transistor region TR, it has an opening OP4 above the area of the polysilicon layer PS to which gate implantation is to be applied. Then, using this resist mask RM4, a gate implantation process is applied by ion implantation to the polysilicon layer PS in the transistor region TR. The impurity implanted into the gate is of the opposite conductivity type to that used for the well implantation and channel implantation. The resist mask RM4 is patterned so that it at least covers the dummy region DR to prevent implantation of impurity ions into the polysilicon layer PS in the dummy region DR during the gate implantation process.

Figure 11:
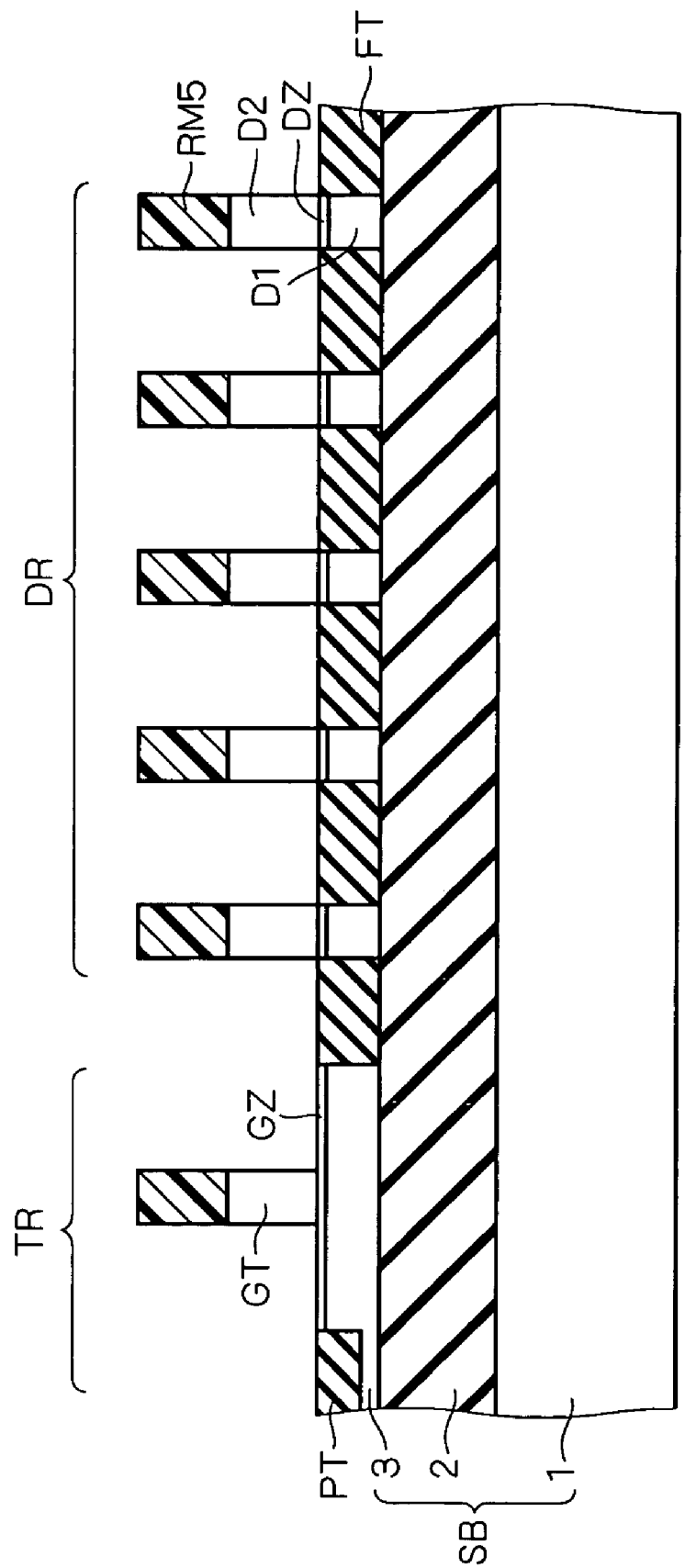

Next, after removal of the resist mask RM4, in the process step of FIG. 11, a resist mask RM5 is patterned so that it covers the area of the transistor region TR that forms the gate electrode GT later and the areas of the dummy region DR that form the dummy gate electrodes D2 later. In this process step, in the dummy region DR, the resist mask RM5 is patterned so as to form, on the dummy active layers D1, dummy gate electrodes D2 shaped nearly the same as the dummy active layers D1 in plan view.

Then, using the resist mask RM5, the polysilicon layer PS is anisotropically etched to pattern the gate electrode GT in the transistor region TR and the dummy gate electrodes D2 in the dummy region DR.

Figure 12:
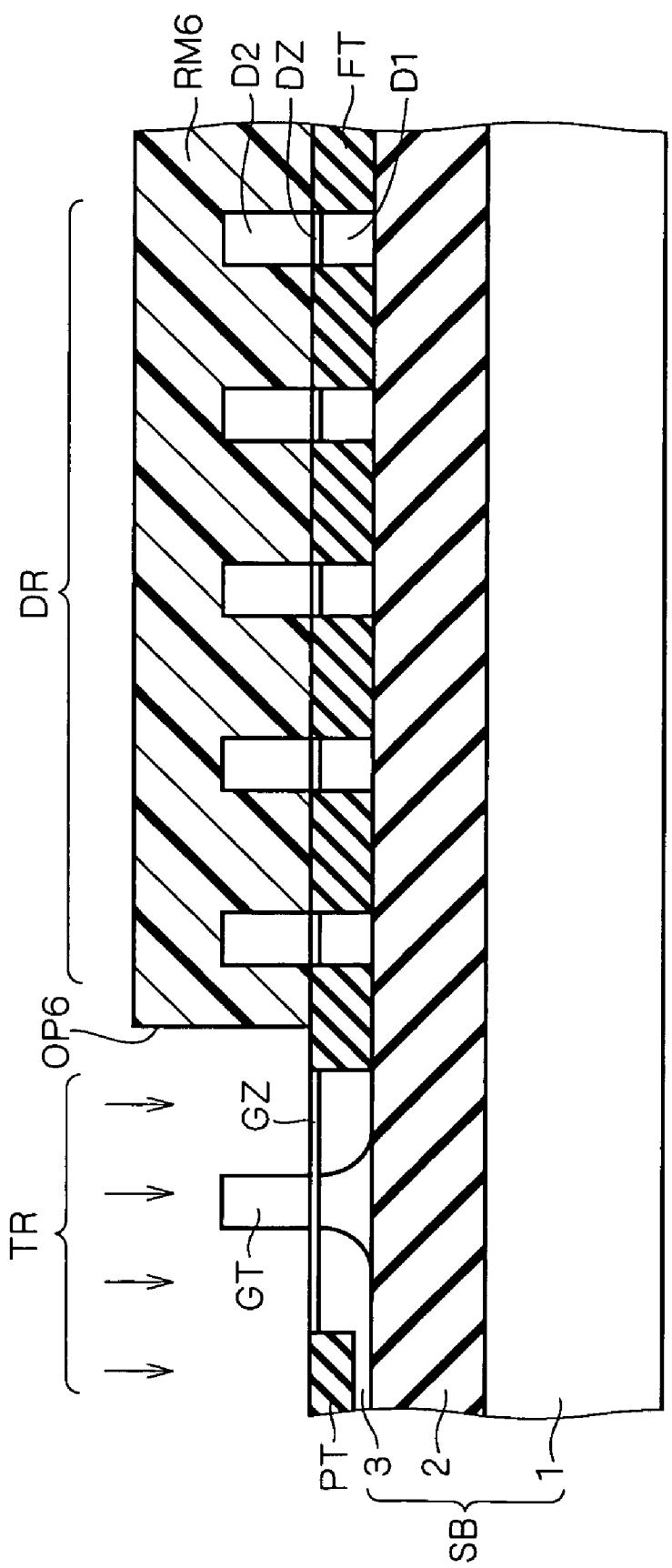

Next, after removal of the resist mask RM5, in the process step of FIG. 12, a resist mask RM6 is patterned so that, in the transistor region TR, it has an opening OP6 above the area of the SOI layer 3 to which source/drain implantation is applied. Then, using the gate electrode GT as a mask, a source/drain implantation process is performed by ion implantation to the SOI layer 3 in the transistor region TR. The resist mask RM6 is patterned to at least cover the dummy region DR and prevents implantation of impurity ions into the dummy active layers D1 during the source/drain implantation process.

After the source/drain implantation process, in the transistor region TR, the portions of the gate insulating film GZ on the SOI layer 3 that are not covered by the gate electrode GT are removed by etching.

The description has shown an example in which a source/drain implantation is performed using the gate electrode GT as a mask, but an LDD (Lightly-Doped Drain) implantation may be performed instead of the source/drain implantation. Alternatively, an ion implantation for forming extension layers (extension implantation), instead of LDD layers, may be performed, and impurities of a conductivity type opposite to that of the extension layers may be ion-implanted into top portions of the extension layers to form pocket layers (pocket implantation). In any impurity implantation process, the dummy region DR is covered by a resist mask so that impurity ions are not implanted into the dummy active layers D1.

In this case, in the gate insulating film GZ on the SOI layer 3 in the transistor region TR, the portions not covered by the gate electrode GT may be left unremoved until the subsequent source/drain implantation process ends.

Figure 13:
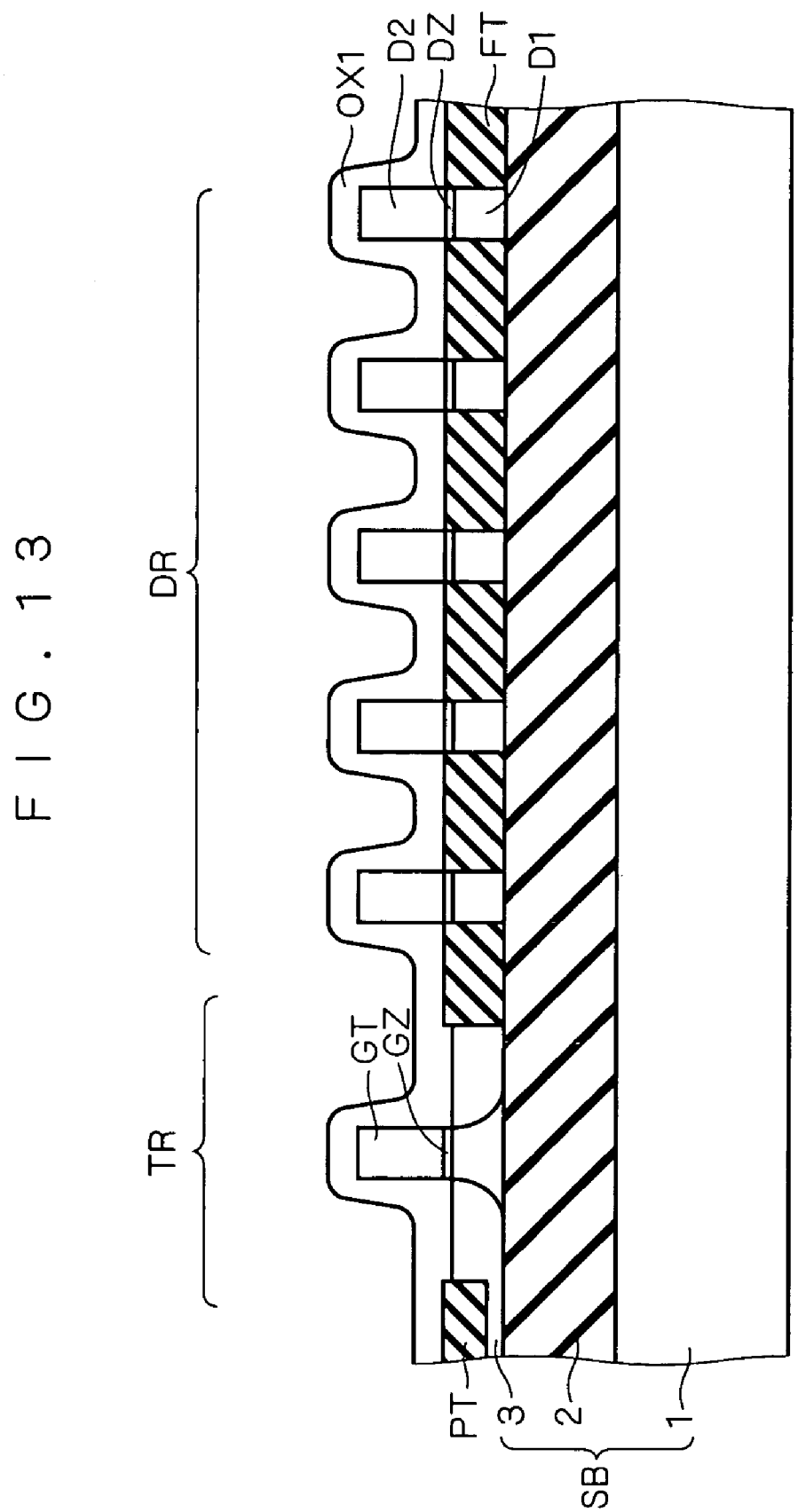

Next, after removal of the resist mask RM6, in the process step of FIG. 13, a silicon oxide film OX1 is deposited, e.g. by CVD, all over the surface of the SOI substrate SB, thus covering the gate electrode GT and the dummy gate electrodes D2 with the silicon oxide film OX1.

Figure 14:
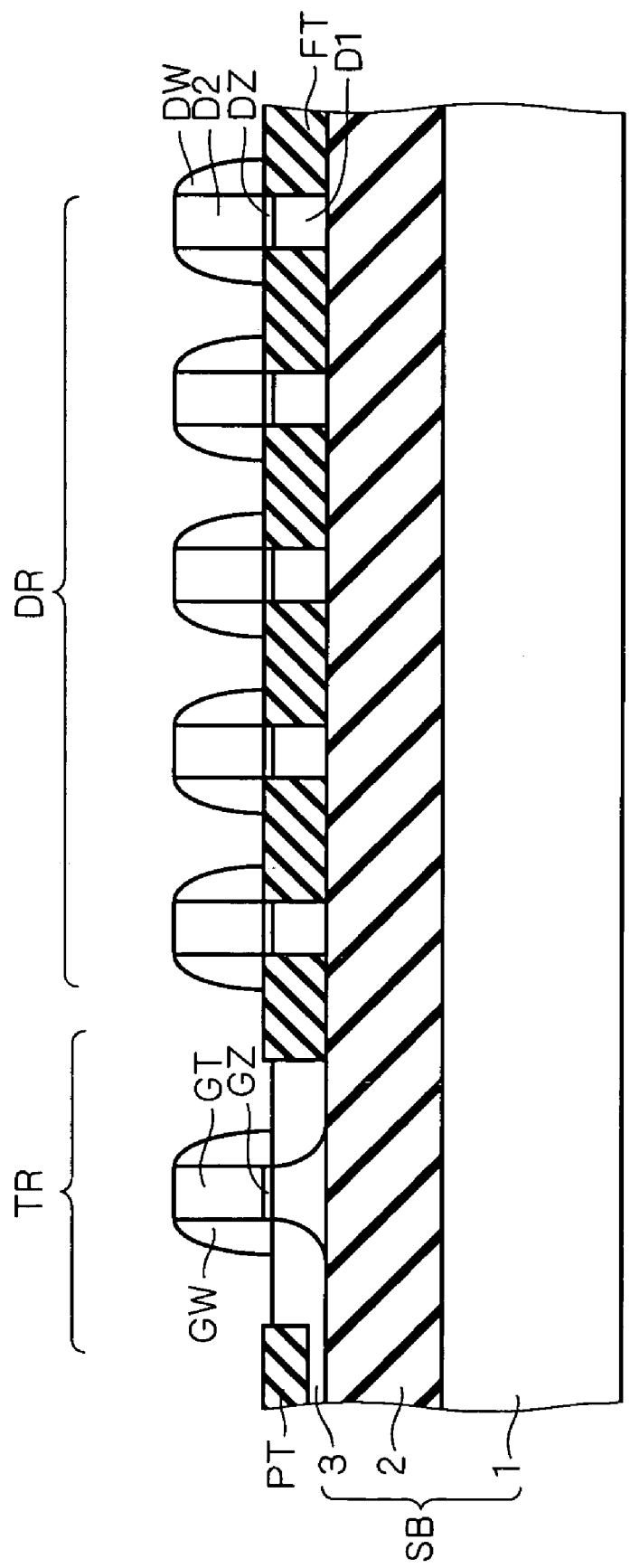

Next, in the process step of FIG. 14, the silicon oxide film OX1 is anisotropically etched to form the sidewall insulating films GW on the side surfaces of the gate electrode GT and the dummy sidewall insulating films DW on the side surfaces of the dummy gate electrodes D2.

The formation of the sidewall insulating films GW may be followed by a source/drain implantation process using the gate electrode GT and the sidewall insulating films GW as a mask, in which case a resist mask patterned to at least cover the dummy region DR is used so that the impurity ions are not implanted into the dummy gate electrodes D2 during the source/drain implantation process.

Figure 15:
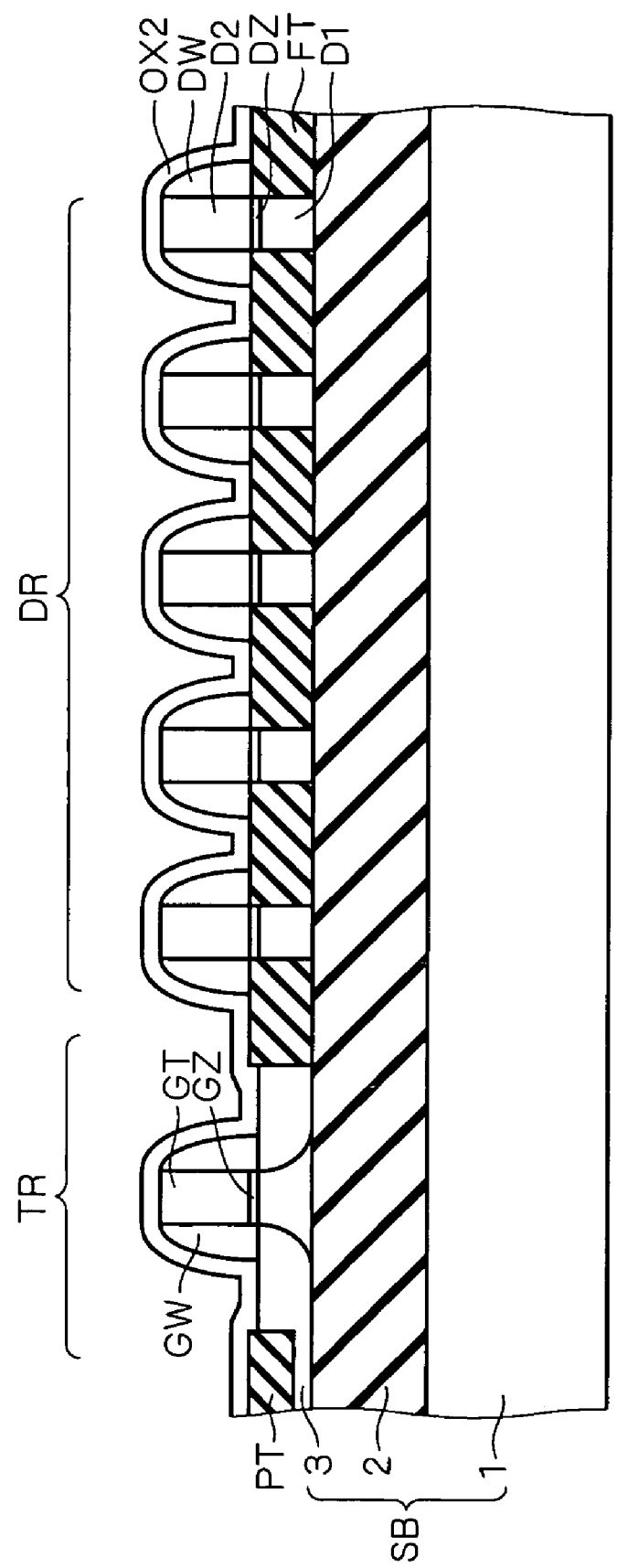

Next, in the process step of FIG. 15, a silicon oxide film OX2 is deposited, e.g. by CVD, on the entire surface of the SOI substrate SB, whereby the gate electrode GT, sidewall insulating films GW, dummy gate electrodes D2, and dummy sidewall insulating films DW are covered by the silicon oxide film OX2. A silicon nitride film may be used in place of the silicon oxide film OX2, or a two-layered film of silicon oxide film and silicon nitride film may be used.

Figure 16:
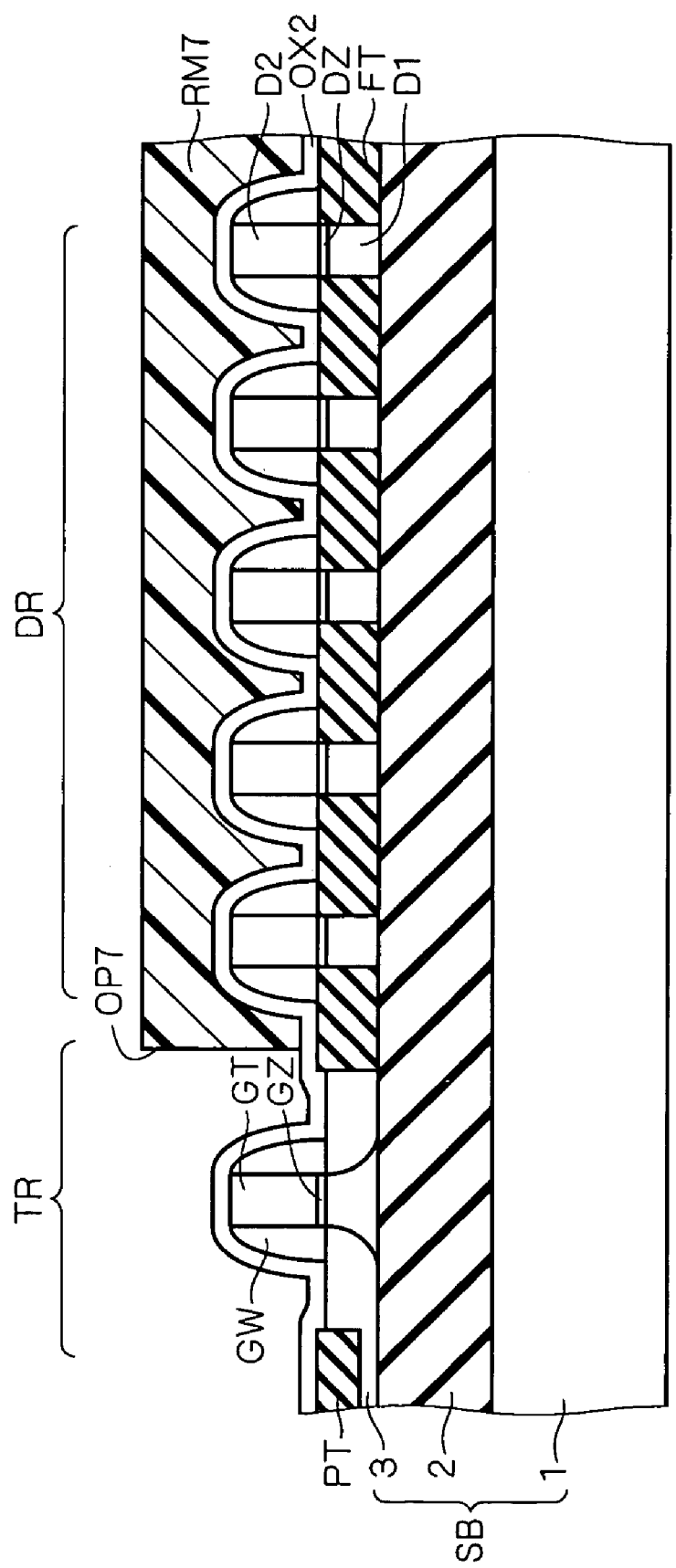

Next, in the process step of FIG. 16, a resist mask RM7 is patterned so that, in the transistor region TR, it has an opening OP7 above the area where silicide films are to be formed. The resist mask RM7 is patterned to cover the dummy region DR at least.

Figure 17:
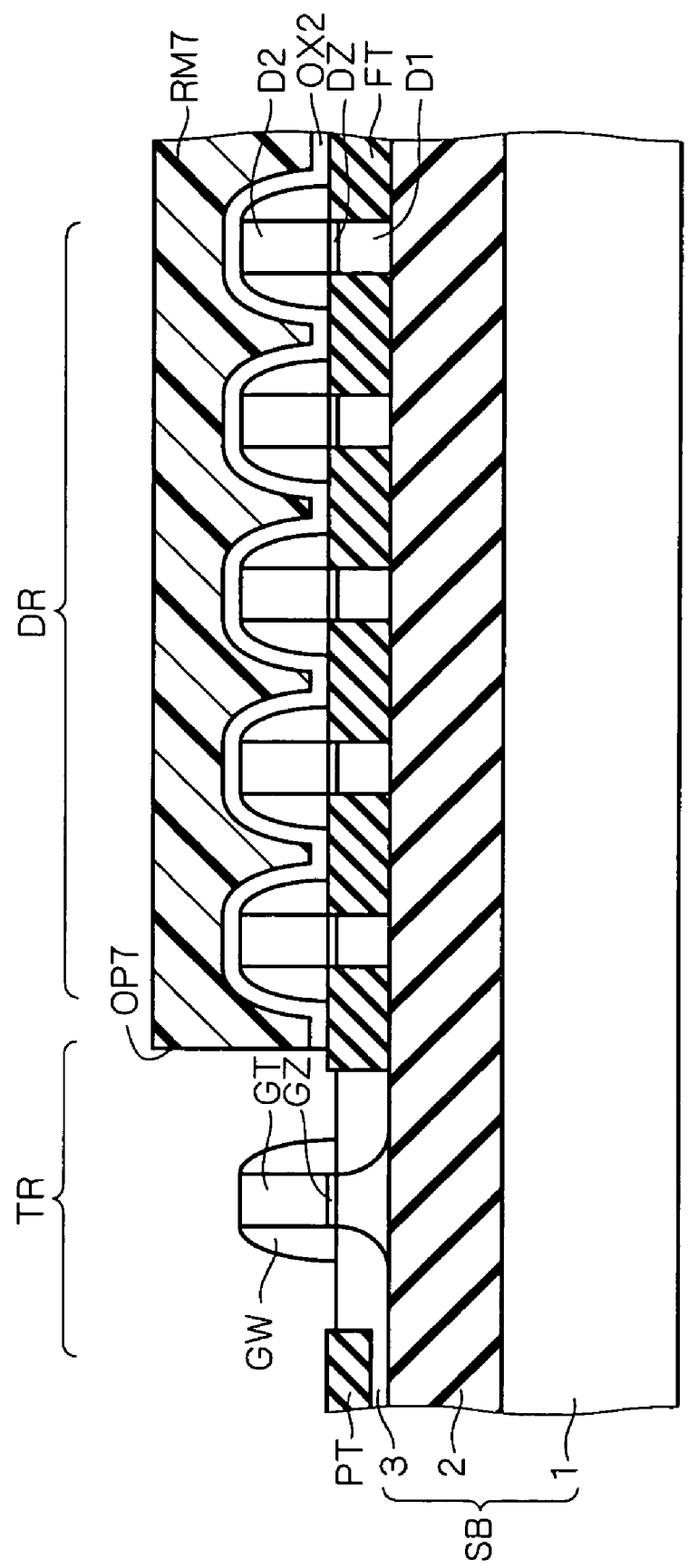

Next, in the process step of FIG. 17, using the resist mask RM7 as a mask, the portion of the silicon oxide film OX2 not covered by the resist mask RM7 is removed by dry-etching. In this case, the silicon oxide film OX2 remains unremoved in the dummy region DR at least.

Figure 18:
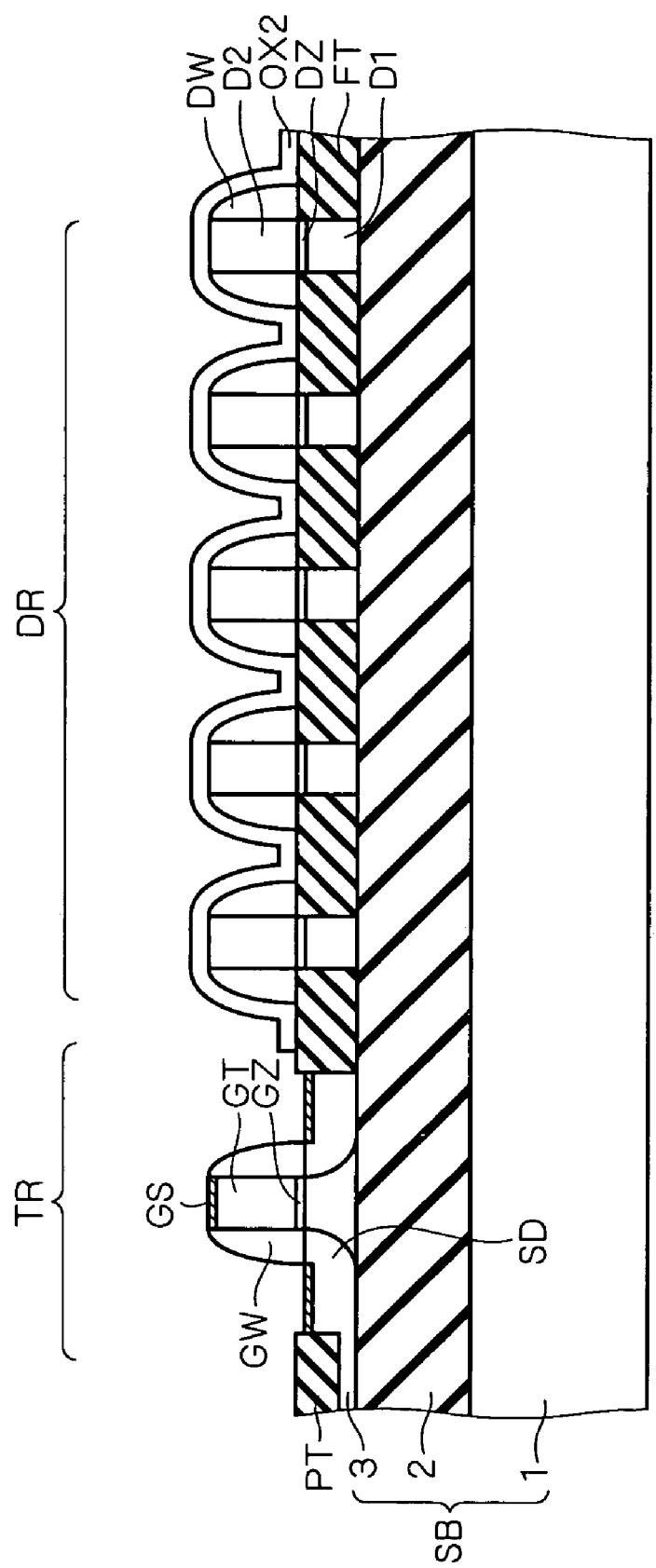

Next, after removal of the resist mask RM7, in the process step of FIG. 18, silicide films are formed on the surfaces of the silicon layer and polysilicon layer that are not covered by the silicon oxide film OX2. Now, a silicide film is formed by a silicidation reaction of a metal film, such as cobalt or titanium, that is formed on the surface of a silicon layer or polysilicon layer, while a metal film formed on an insulating film, such as silicon oxide film or silicon nitride film, is not silicided. Therefore it is possible to form a silicide film only on the surface of a silicon layer or polysilicon layer by removing the unsilicided metal film portion.

In FIG. 18, the silicon oxide film OX2 remaining in the dummy region DR functions as a silicide protection film and therefore no silicide film is formed on the upper surfaces of the dummy gate electrodes D2 in the dummy region DR. In the transistor region TR, the silicide films SS and GS are formed respectively on the exposed surfaces of the SOI layer 3, i.e. on the source/drain regions SD, and on the top surface of the gate electrode GT.

Figure 19:
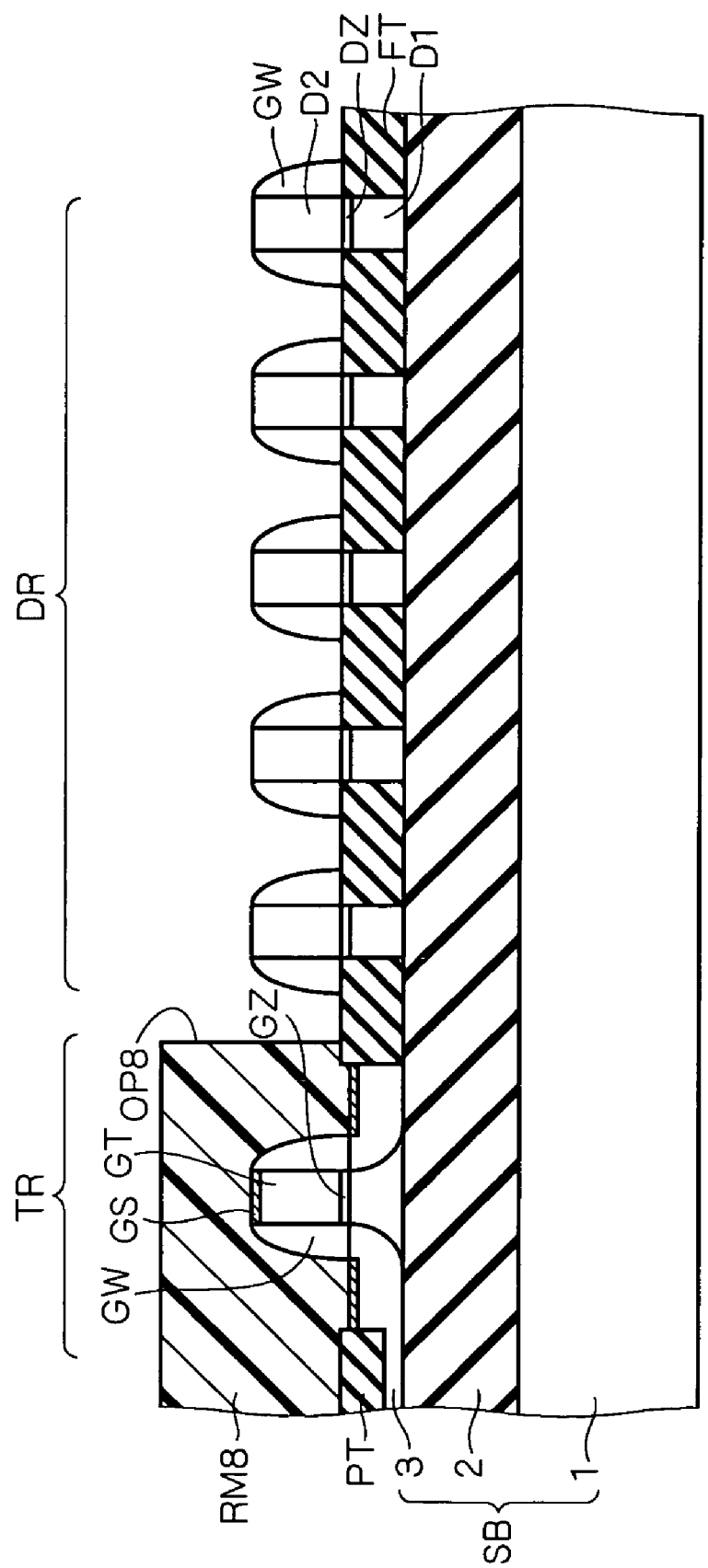

Next, in the process step of FIG. 19, a resist mask RM8 is patterned so that it has an opening OP8 in the area where the silicon oxide film OX2 resides and then the silicon oxide film OX2 is removed by dry-etching using the resist mask RM8. The resist mask RM8 is patterned so that the opening OP8 is formed in the dummy region DR at least.

Figure 20:
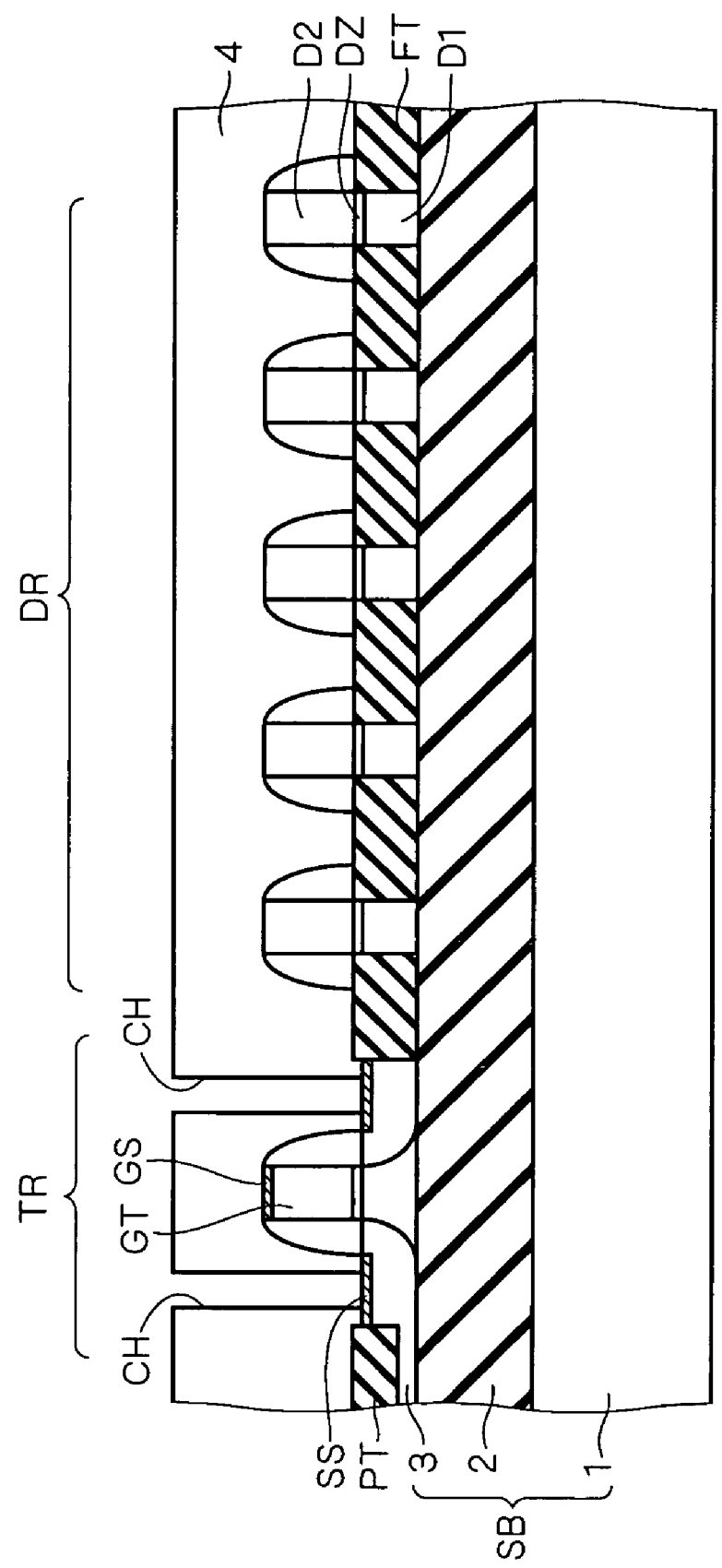

Next, after removal of the resist mask RM8, in the process step of FIG. 20, the interlayer insulating film 4 is deposited, e.g. by CVD, all over the surface of the SOI substrate SB and contact holes CH are formed in the transistor region TR so that they pass through the interlayer insulating film 4 to reach the silicide films SS.

This process step is followed by conventional steps of filling the contact holes CH with a conductor layer to form the contacts CP1, forming, on the interlayer insulating film 4, the interconnections WL1 connected to the contacts CP1 and the interconnection WL electrically connected to the spiral inductor SI (FIG. 2), and depositing the interlayer insulating film 5 on the interlayer insulating film 4, e.g. by CVD. Then the contact CP is formed to pass through the interlayer insulating film 5 to reach the interconnection WL and the spiral inductor SI is formed on the interlayer insulating film 5, so as to obtain the semiconductor device 100 shown in FIG. 2.

<D. Functions and Effects>

According to the semiconductor device 100 of the preferred embodiment of the invention, in the CMP process for the formation of the trench isolation insulating films, the existence of the plurality of dummy active layers D1 on the SOI substrate SB, under the spiral inductor SI, prevents dishing by the CMP process.

Also, in semiconductor devices with gate lengths of 0.1 μm or less, differences are very likely to occur among the dimensions of gate electrodes located in different positions around the area under the spiral inductor. It seems that this phenomenon occurs because total absence of gate electrode pattern in the large area under the spiral inductor causes the etching rate of the gate electrode layer in the vicinity thereof to differ from the etching rates in other areas. However, in the semiconductor device 100, the presence of the plurality of dummy gate electrodes D2 on the SOI substrate SB under the spiral inductor SI prevents the differences in the gate electrode etching rate between the vicinity of the region (the dummy region) under the spiral inductor SI and other areas, which prevents the differences of the dimensions of gate electrodes located in different positions.

Also, as mentioned referring to FIGS. 8 and 12, the dummy active layers D1 are protected from the impurity ion implantation during the well implantation, channel implantation, LDD implantation and source/drain implantation processes. Therefore the electrical resistance of the dummy active layers D1 is kept high at the original resistance value of the SOI layer 3. This effectively blocks the path of eddy current that would otherwise cause electromagnetic induction loss and thus suppresses the Q-value reduction.

Also, since the arrangement pattern of the dummy active layers D1 and the arrangement pattern of the dummy gate electrodes D2 are nearly matched, the dummy gate electrodes D2 are placed accurately on the dummy active layers D1, which prevents silicide film formation on the dummy active layers D1.

This prevents reduction of the electrical resistance of the dummy active layers D1 and effectively blocks the eddy current path that would cause electromagnetic induction loss, thus suppressing the Q-value reduction.

Furthermore, as described referring to FIG. 10, the dummy gate electrodes D2 are protected from the impurity ion implantation during the gate implantation process. Therefore the electrical resistance of the dummy gate electrodes D2 is kept high at the original value of the non-doped polysilicon layer PS, which effectively blocks the eddy current path that would cause electromagnetic induction loss and thus suppresses the Q-value reduction.

Also, since, as described referring to FIGS. 15 to 18, no silicide films are formed on the top surfaces of the dummy gate electrodes D2, the electrical resistance of the dummy gate electrodes D2 is not lowered, which effectively blocks the eddy current path that would cause electromagnetic induction loss and thus suppresses the Q-value reduction.

<E. Modification>

In the semiconductor device 100 of the preferred embodiment of the invention, as shown in FIG. 2, the arrangement pattern of the dummy active layers D1 and the arrangement pattern of the dummy gate electrodes D2 are nearly matched so that the dummy gate electrodes D2 are placed accurately on the dummy active layers D1. However, the structure is not limited to the preferred embodiment.

Figure 21:
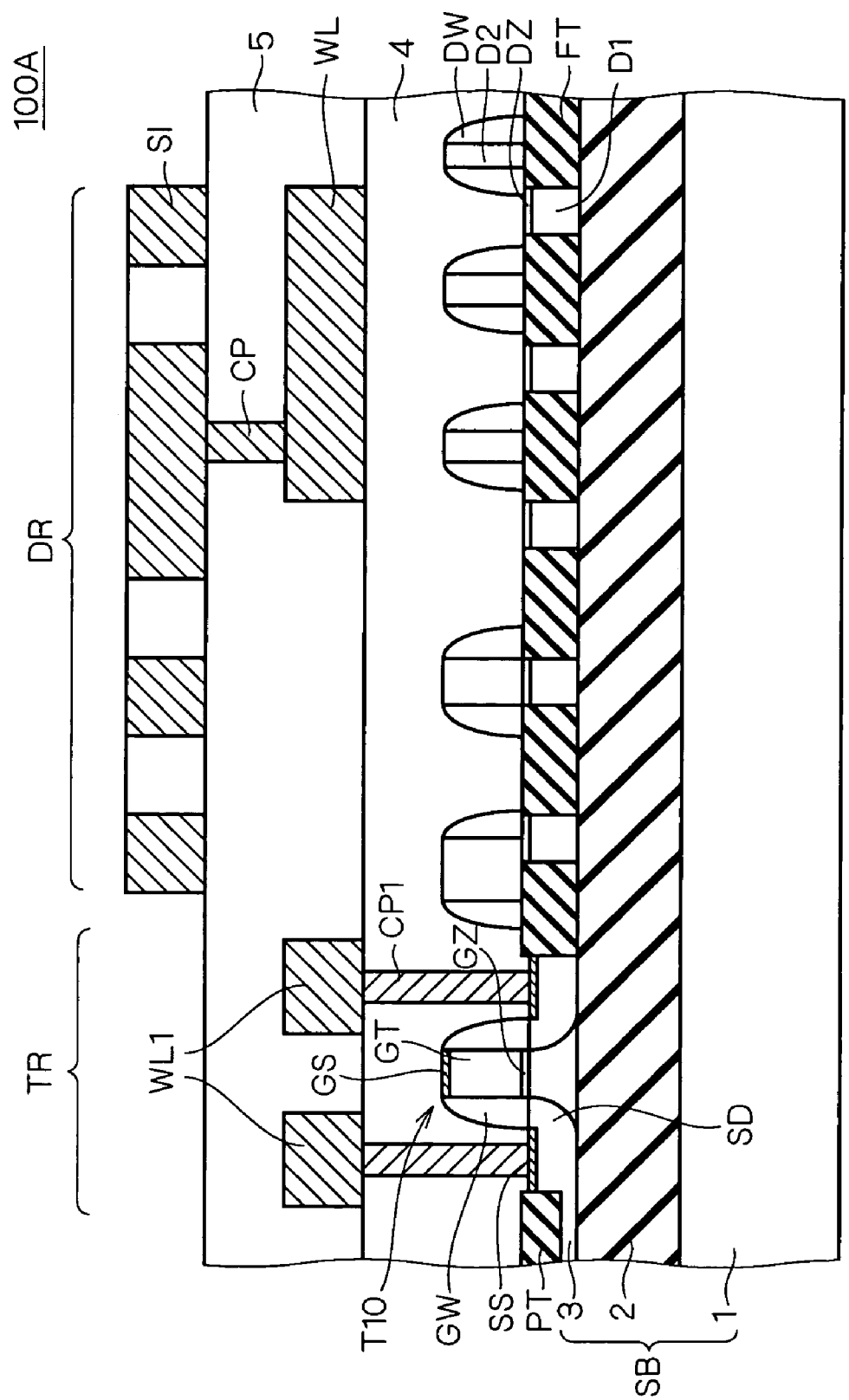
FIGS. 21 to 24 are cross-sectional views illustrating process steps for manufacturing the semiconductor device according to a modification of the preferred embodiment of the invention.

That is to say, a semiconductor device 100A may be constructed as shown in FIG. 21, in which the arrangement pattern of the dummy active layers D1 and the arrangement pattern of the dummy gate electrodes D2 are not perfectly matched and so the dummy gate electrodes D2 are not precisely aligned on the dummy active layers D1, where some dummy active layers D1 are only partially covered by dummy gate electrodes D2 and no dummy gate electrodes D2 are present on some dummy active layers D1. Also, the dummy gate electrodes D2 are not necessarily shaped the same as the dummy active layers D1 in plan view.

Note that, also in the semiconductor device 100A, as in the semiconductor device 100, the dummy active layers D1 are protected from implantation of impurity ions during any impurity implantation processes including LDD implantation, extension implantation, source/drain implantation, and pocket implantation, and the dummy gate electrodes D2 are protected from the implantation of impurity ions during the gate implantation process.

However, in the semiconductor device 100A, since some dummy active layers D1 are not covered by dummy gate electrodes D2, a measure is taken during the silicide film formation so that no silicide film is formed on the exposed surfaces of the dummy active layers D1.

Figure 22:
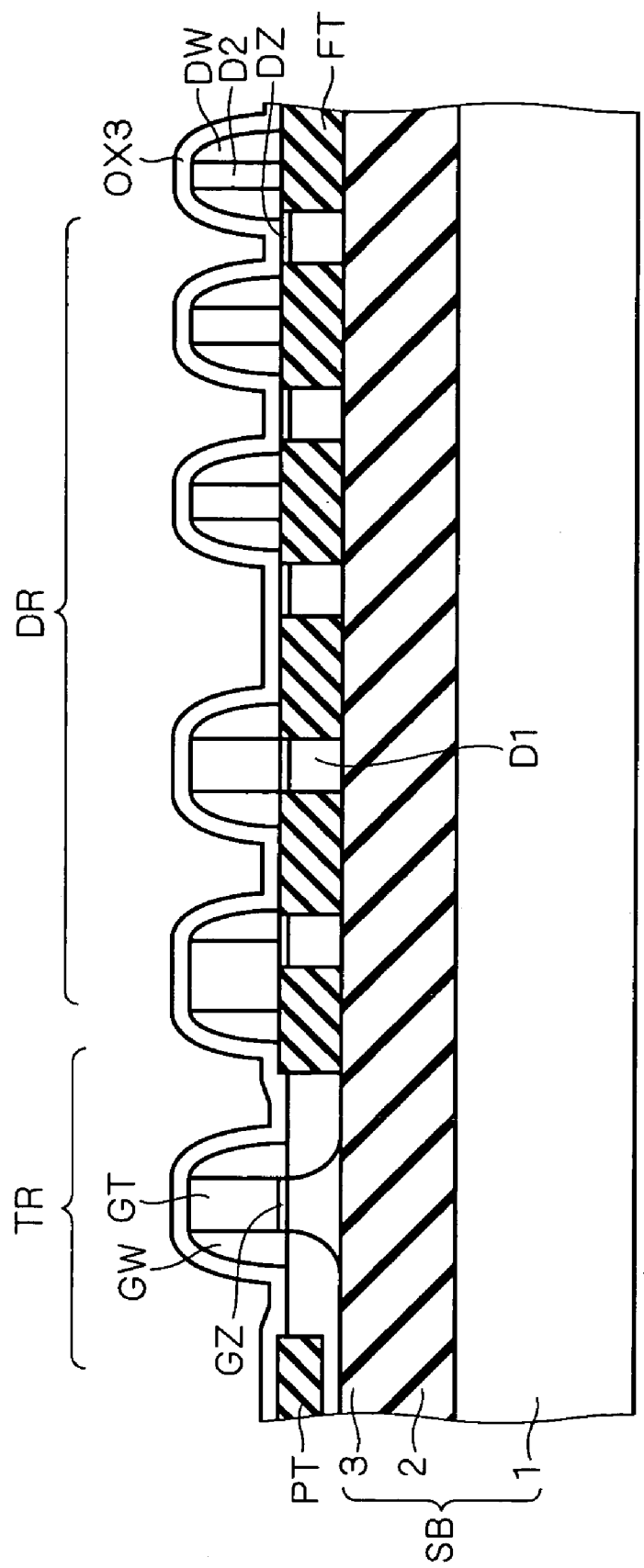

Specifically, as shown in FIG. 22, a silicon oxide film OX3 is deposited, e.g. by CVD, all over the surface of the SOI substrate SB so that the silicon oxide film OX3 covers the gate electrode GT, sidewall insulating films GW, dummy gate electrodes D2, dummy sidewall insulating films DW, and the exposed surfaces of the dummy active layers D1. A silicon nitride film may be used in place of the silicon oxide film OX3, or a two-layered film of silicon oxide film and silicon nitride film may be used.

Figure 23:
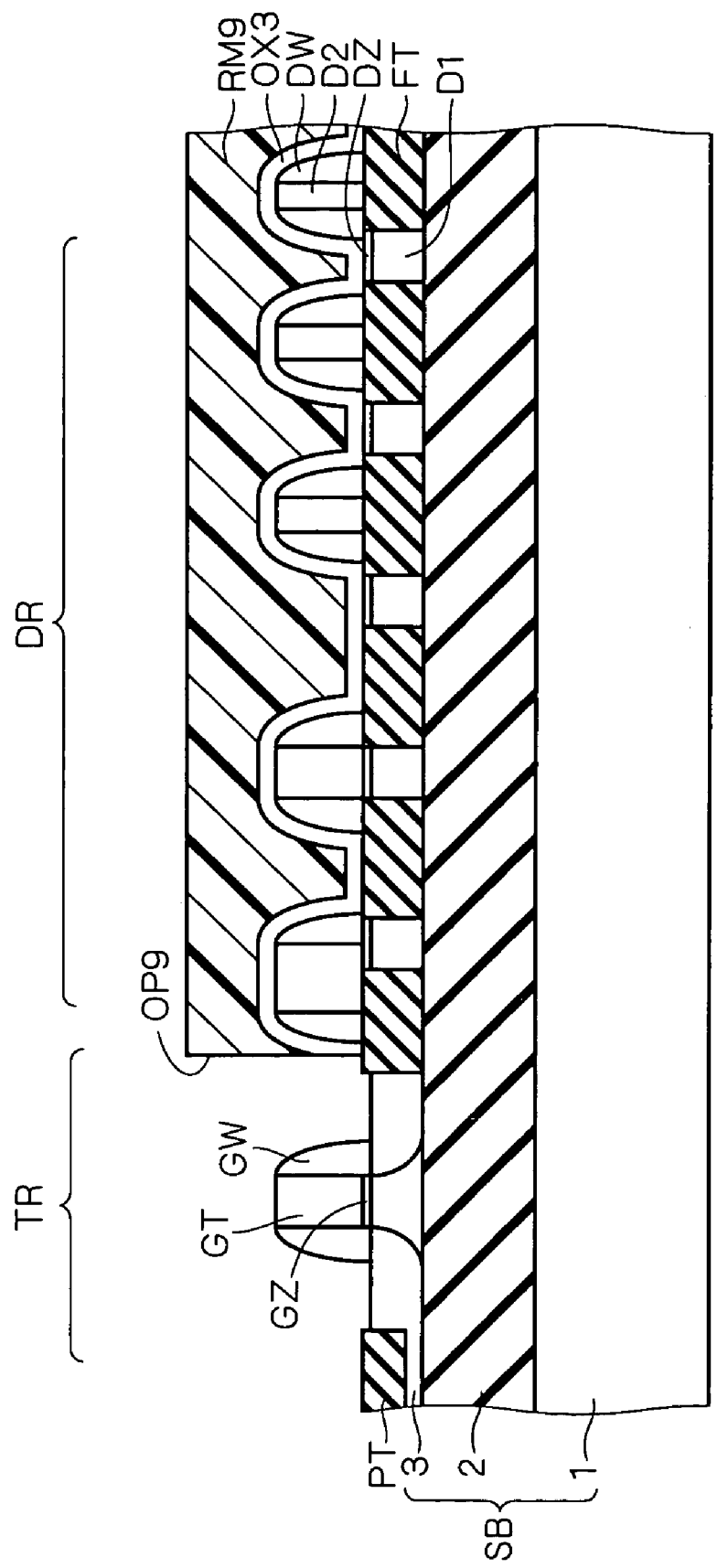

Next, in the process step of FIG. 23, a resist mask RM9 is patterned so that, in the transistor region TR, it has an opening OP9 in the area where silicide films are to be formed. The resist mask RM9 is patterned so that it at least covers the dummy region DR.

Then, using the resist mask RM9 as a mask, the portion of the silicon oxide film OX3 that is not covered by the resist mask RM9 is removed by dry-etching. In this case, the silicon oxide film OX3 remains unremoved in the dummy region DR at least.

Next, after removal of the resist mask RM9, silicide films are formed on the surfaces of the silicon and polysilicon layers that are not covered by the silicon oxide film OX3. Then the silicon oxide film OX3 is removed to obtain the structure shown in FIG. 24.

Figure 24:
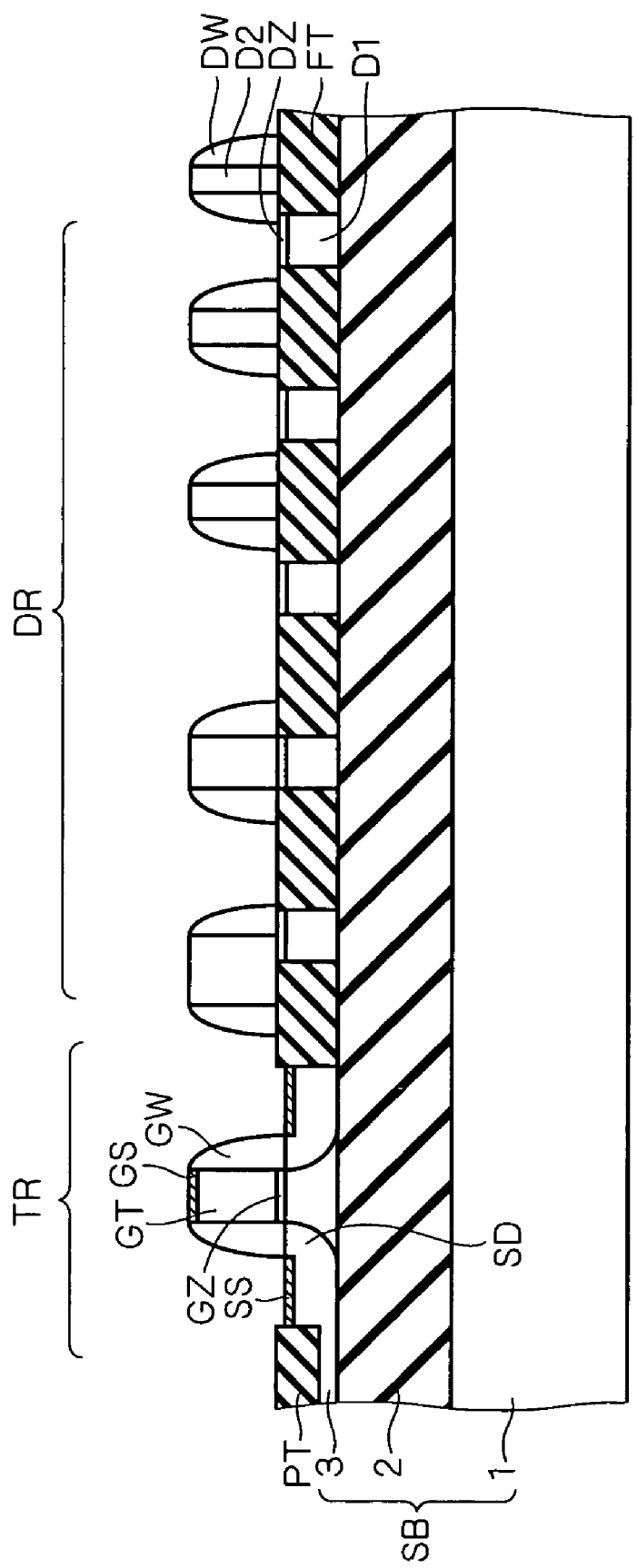

FIG. 24 shows a structure in which, in the transistor region TR, the silicide films SS and GS are formed respectively on the exposed surfaces of the SOI layer 3, i.e. on the source/drain regions DS, and on the top surface of the gate electrode GT. In the dummy region DR, no silicide film is formed on the top surfaces of the dummy gate electrodes D2 and the exposed surfaces of the dummy active layers D1.

Even when, as shown in the semiconductor device 100A, the dummy gate electrodes D2 are not accurately placed on the dummy active layers D1 and so some dummy active layers D1 are exposed, no problem arises as long as it is possible to prevent silicide film formation on the exposed surfaces of the dummy active layers D1.

That is to say, while the arrangement of the dummy active layers D1 and the arrangement of the dummy gate electrodes D2 are both achieved by automatic placement and routing with a computer, the dummy gate electrodes D2 may not be placed accurately on the dummy active layers D1 because their arrangements use different placement rules. However, as long as it is possible to prevent silicide film formation on exposed surfaces of dummy active layers D1, the reduction of electrical resistance of the dummy active layers D1 is prevented and the dummy active layers D1 effectively block the eddy current path that would cause electromagnetic induction loss, so as to maintain the capability of suppressing the Q-value reduction.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
    an SOI substrate having a substrate portion as a foundation, a buried oxide film provided on said substrate portion, and an SOI layer provided on said buried oxide film;
    an inductance element provided above said SOI layer;
    an MOS transistor provided on said SOI substrate;
    a plurality of first active layers provided in a main surface of said SOI layer in a first region under said inductance element, said plurality of first active layers being electrically isolated from outside of the semiconductor device and being independent of, and electrically isolated from, each other; and
    a plurality of first gate electrodes provided on said main surface of said SOI layer in said first region being electrically isolated from outside of the semiconductor device and being independent of, and electrically isolated from, each other.

2. The semiconductor device according to claim 1, wherein an arrangement pattern of said plurality of first gate electrodes nearly matches with an arrangement pattern of said plurality of first active layers and said plurality of first gate electrodes are aligned on said plurality of first active layers.

3. The semiconductor device according to claim 1, wherein said plurality of first active layers are formed of portions of said SOI layer that are separated and electrically isolated from each other by an isolation insulating film that extends from the surface of said SOI layer to reach said buried oxide film through said SOI layer.

4. The semiconductor device according to claim 1, wherein, during manufacture, said plurality of first gate electrodes are protected from introduction of impurities into said MOS transistor.

5. The semiconductor device according to claim 4, wherein surfaces of said plurality of first gate electrodes are protected from silicide film formation on at least one of a gate electrode and a source/drain layer of said MOS transistor.

6. The semiconductor device according to claim 1, wherein, during manufacture, said plurality of first active layers are protected from introduction of impurities into said MOS transistor.

7. The semiconductor device according to claim 6, wherein surfaces of said plurality of first active layers are protected from silicide film formation on at least one of a gate electrode and a source/drain layer of said MOS transistor.

* * * * *

UNITED STATES PATENT AND TRADEMARK OFFICE
CERTIFICATE OF CORRECTION

| | | |
|---|---|---|
| PATENT NO. | : 7,183,624 B2 | Page 1 of 1 |
| APPLICATION NO. | : 10/887839 | |
| DATED | : February 27, 2007 | |
| INVENTOR(S) | : Takashi Ipposhi | |

It is certified that error appears in the above-identified patent and that said Letters Patent is hereby corrected as shown below:

TITLE PAGE
Item "(56) References Cited", "FOREIGN PATENT DOCUMENTS", insert Japanese reference -- JP 2002-110908    4/2002 --.

Signed and Sealed this

Nineteenth Day of June, 2007

JON W. DUDAS
*Director of the United States Patent and Trademark Office*